(12) United States Patent
Aylward

(10) Patent No.: US 8,238,578 B2
(45) Date of Patent: Aug. 7, 2012

(54) ELECTROACOUSTICAL TRANSDUCING WITH LOW FREQUENCY AUGMENTING DEVICES

(75) Inventor: J. Richard Aylward, Ashland, MA (US)

(73) Assignee: Bose Corporation, Framingham, MA (US)

( * ) Notice: Subject to any disclaimer, the term of this patent is extended or adjusted under 35 U.S.C. 154(b) by 217 days.

(21) Appl. No.: 12/684,346

(22) Filed: Jan. 8, 2010

(65) Prior Publication Data
US 2010/0119081 A1    May 13, 2010

Related U.S. Application Data

(62) Division of application No. 10/383,697, filed on Mar. 7, 2003, now Pat. No. 7,676,047, and a division of application No. 10/309,395, filed on Dec. 3, 2002, now abandoned.

(51) Int. Cl.
| | |
|---|---|
| H03G 5/00 | (2006.01) |
| H03G 7/00 | (2006.01) |
| H03G 9/00 | (2006.01) |
| H04B 15/00 | (2006.01) |

(52) U.S. Cl. ........ 381/102; 381/106; 381/94.8; 381/103
(58) Field of Classification Search .................... 381/97, 381/102–109, 94.8
See application file for complete search history.

(56) References Cited

U.S. PATENT DOCUMENTS

| | | | |
|---|---|---|---|
| 3,670,106 A | 6/1972 | Orban | |
| 3,687,220 A | 8/1972 | Virva | |
| 3,903,989 A | 9/1975 | Bauer | |
| 4,031,321 A | 6/1977 | Bakgaard | |
| 4,032,321 A | 6/1977 | Gibbons | |
| 4,181,819 A | 1/1980 | Cammack | |
| 4,199,658 A | 4/1980 | Iwahara | |
| 4,495,643 A | 1/1985 | Orban | |
| 4,517,149 A | 5/1985 | Oka et al. | |
| 4,569,074 A | 2/1986 | Polk | |
| 4,628,528 A | 12/1986 | Bose et al. | |
| 4,815,559 A | 3/1989 | Shirley | |
| 4,817,149 A | 3/1989 | Myers | |
| 4,924,962 A | 5/1990 | Terai et al. | |
| 4,932,060 A | 6/1990 | Schreiber | |
| 5,046,076 A | 9/1991 | Hill | |
| 5,168,526 A * | 12/1992 | Orban | 381/94.8 |
| 5,294,958 A | 3/1994 | Isobe et al. | |

(Continued)

FOREIGN PATENT DOCUMENTS

EP    0481821 A2    4/1992

(Continued)

OTHER PUBLICATIONS

EP Examination Report dated Sep. 17, 2010 for EP03104483.7.

(Continued)

*Primary Examiner* — Devona Faulk
(74) *Attorney, Agent, or Firm* — Bose Corporation

(57) ABSTRACT

A method for clipping and post-clipping processing an audio signal, includes clipping an audio signal to provide a clipped audio signal; filtering, by a first filter, the audio signal to provide a filtered unclipped audio signal; and filtering, by a second filter, the clipped audio signal to provide a filtered clipped audio signal. The method further includes differentially combining the filtered clipped audio signal and the clipped audio signal to provide a differentially combined audio signal; and combining the filtered unclipped audio signal and the differentially combined audio signal to provide an output signal.

4 Claims, 26 Drawing Sheets

U.S. PATENT DOCUMENTS

| | | | |
|---|---|---|---|
| 5,459,790 A | 10/1995 | Scofield et al. |
| 5,521,981 A | 5/1996 | Gehring |
| 5,546,468 A | 8/1996 | Beard |
| 5,588,063 A | 12/1996 | Edgar |
| 5,621,804 A | 4/1997 | Beppu |
| 5,661,812 A | 8/1997 | Scofield et al. |
| 5,666,424 A | 9/1997 | Fosgate et al. |
| 5,809,153 A | 9/1998 | Aylward et al. |
| 5,821,471 A | 10/1998 | McCuller |
| 5,841,879 A | 11/1998 | Scofield et al. |
| 5,844,176 A | 12/1998 | Clark |
| 5,870,484 A | 2/1999 | Greenberger |
| 5,870,848 A | 2/1999 | Ohmura |
| 5,901,235 A | 5/1999 | Thigpen et al. |
| 5,946,401 A | 8/1999 | Ferren |
| 5,988,314 A | 11/1999 | Negishi |
| 5,995,631 A | 11/1999 | Kamada et al. |
| 5,997,091 A | 12/1999 | Rech et al. |
| 6,055,320 A | 4/2000 | Wiener et al. |
| 6,067,361 A | 5/2000 | Kohut et al. |
| 6,081,602 A | 6/2000 | Meyer et al. |
| 6,141,428 A | 10/2000 | Narus |
| 6,144,747 A | 11/2000 | Scofield et al. |
| 6,154,549 A | 11/2000 | Arnold et al. |
| 6,154,553 A | 11/2000 | Taylor |
| 6,263,083 B1 | 7/2001 | Weinreich |
| 6,332,026 B1 | 12/2001 | Kuusama et al. |
| 6,506,116 B1 | 1/2003 | Sunaga et al. |
| 6,643,375 B1 | 11/2003 | Philp et al. |
| 6,853,732 B2 | 2/2005 | Scofield |
| 6,935,946 B2 | 8/2005 | Yoseloff et al. |
| 7,164,773 B2 | 1/2007 | Fabry |
| 7,343,018 B2 | 3/2008 | van der Werff |
| 7,343,020 B2 | 3/2008 | Thigpen |
| 7,577,260 B1 | 8/2009 | Hooley et al. |
| 7,684,577 B2 | 3/2010 | Arai et al. |
| 2002/0006206 A1 | 1/2002 | Scofield |
| 2002/0085731 A1 | 7/2002 | Aylward |
| 2004/0016982 A1 | 1/2004 | Nakajima |
| 2004/0105550 A1 | 6/2004 | Aylward et al. |
| 2004/0105559 A1 | 6/2004 | Aylward et al. |
| 2004/0196982 A1 | 10/2004 | Aylward et al. |

FOREIGN PATENT DOCUMENTS

| | | |
|---|---|---|
| EP | 0593191 A1 | 4/1994 |
| EP | 0637191 A2 | 2/1995 |
| EP | 0854660 A2 | 7/1998 |
| EP | 1132720 A2 | 9/2001 |
| EP | 1137319 | 9/2001 |
| EP | 1194007 A2 | 4/2002 |
| EP | 1272004 A2 | 1/2003 |
| EP | 1427254 A2 | 6/2004 |
| JP | 63292800 A | 11/1988 |
| JP | 3070553 A | 3/1991 |
| JP | 05-344584 | 12/1993 |
| JP | 06245288 A | 9/1994 |
| JP | 08116587 A | 5/1996 |
| JP | 11215586 A | 8/1999 |
| JP | 11298985 A | 10/1999 |
| JP | 200129878 | 10/2001 |
| WO | 93/14606 A1 | 7/1993 |
| WO | 96/33591 A1 | 10/1996 |
| WO | 00/19415 A2 | 4/2000 |
| WO | 02/17295 A1 | 2/2002 |
| WO | 02/065815 A2 | 8/2002 |

OTHER PUBLICATIONS

CN Office Action dated Nov. 10, 2010 for CN 200310118723.3.
EP Communication dated Jun. 24, 2010 for EP Appln. No. 03104482.9-1224/1427253.
JP Communication dated Dec. 16, 2008 for JP Appln. No. 2003-405006.
CN Communication dated Jul. 10, 2009 for CN Appl. No. 200310119707.6.
JP Communication dated Nov. 25, 2009 for JP 2003-404963.
CN Office Action dated Jul. 11, 2008 in CN Appl. No. 200310118723.3.
CN Rejection dated Jul. 10, 2009 for CN Appl. No. 200310119707.6.
CN Rejection dated Nov. 27, 2009 for Appl. No. 2003101187233.
CN Office Action dated Jul. 4, 2008 in CN Appl. No. 200310119707.6.
CN Office Action dated Jun. 12, 2009 for CN Appl. No. 200310118723.3.
CN Office Action dated Mar. 13, 2009 in CN Appl. No. 200310118723.3.
EP Search report in App. No. 03104482 dated Mar. 10, 2006.
EP Search Report in Application No. 03104483 dated Sep. 26, 2006.
EP Examination Report issued Aug. 3, 2007, in EP Appl. No. 03104483.7.
EP Examination Report issued Apr. 25, 2007, in EP Appl. No. 03104482.9.
EP Search Report in App. No. 03104482 dated Jul. 13, 2005.
JP Office Action dated Dec. 16, 2008 for Appl. No. 2003-405006.
JP Office Action dated dated May 19, 2009 for JP Appl. No. 2003-404963.
JP Rejection dated Dec. 1, 2009 for JP Appl. No. 2003-404963.
JP Official Inquiry dated Jun. 22, 2010 in JP Appl. No. 2003-405006.
JP Office Action dated May 19, 2008 in JP Appl. No. 2003-405006.
Office Action in corresponding Chinese app. No. 200310118723.3, dated Jun. 12, 2009.
Office Action in corresponding Chinese app. No. 200310119707.6, dated Jul. 10, 2009.
Office Action dated Dec. 1, 2009 from Japanese app. No. 2003-404963.

\* cited by examiner

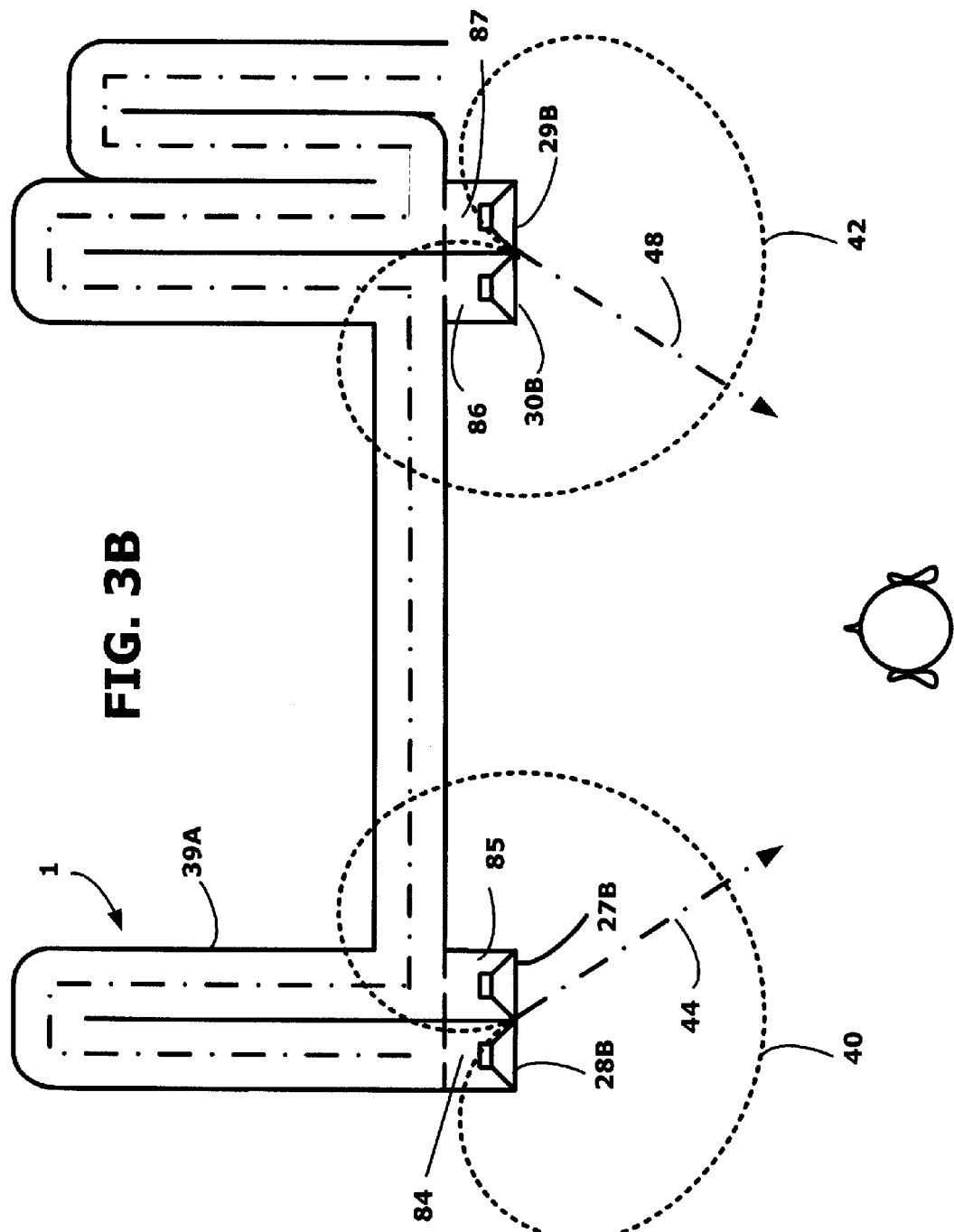

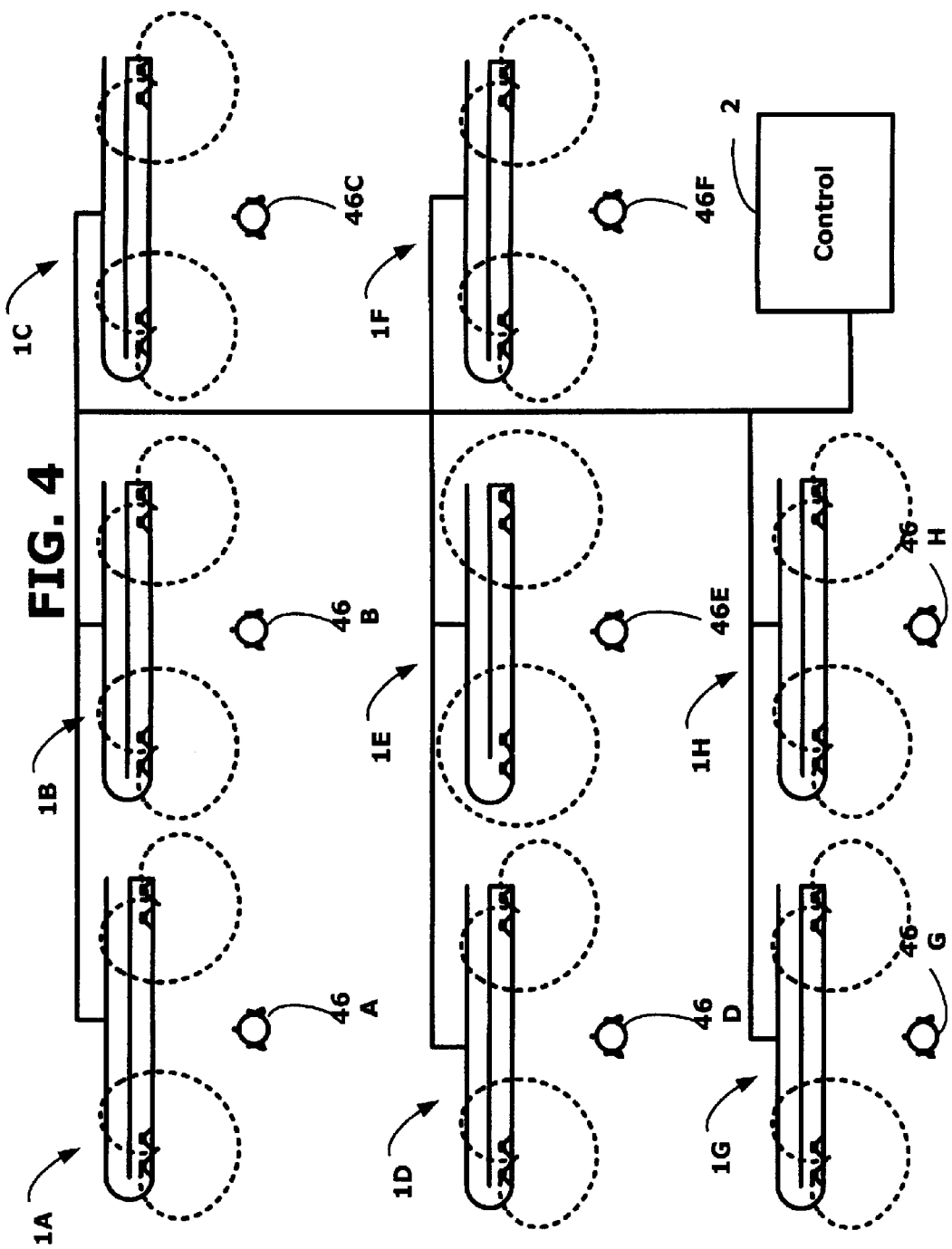

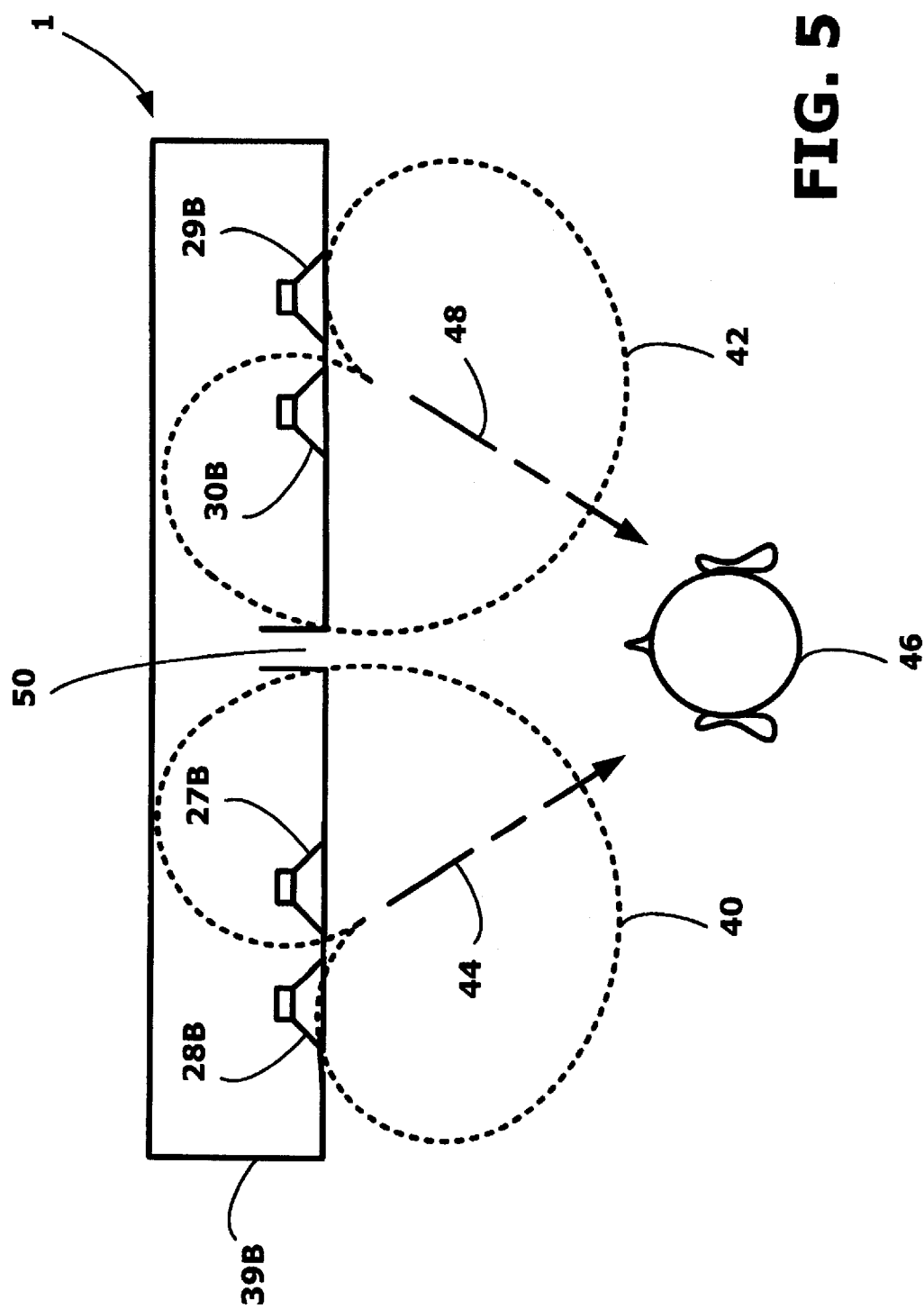

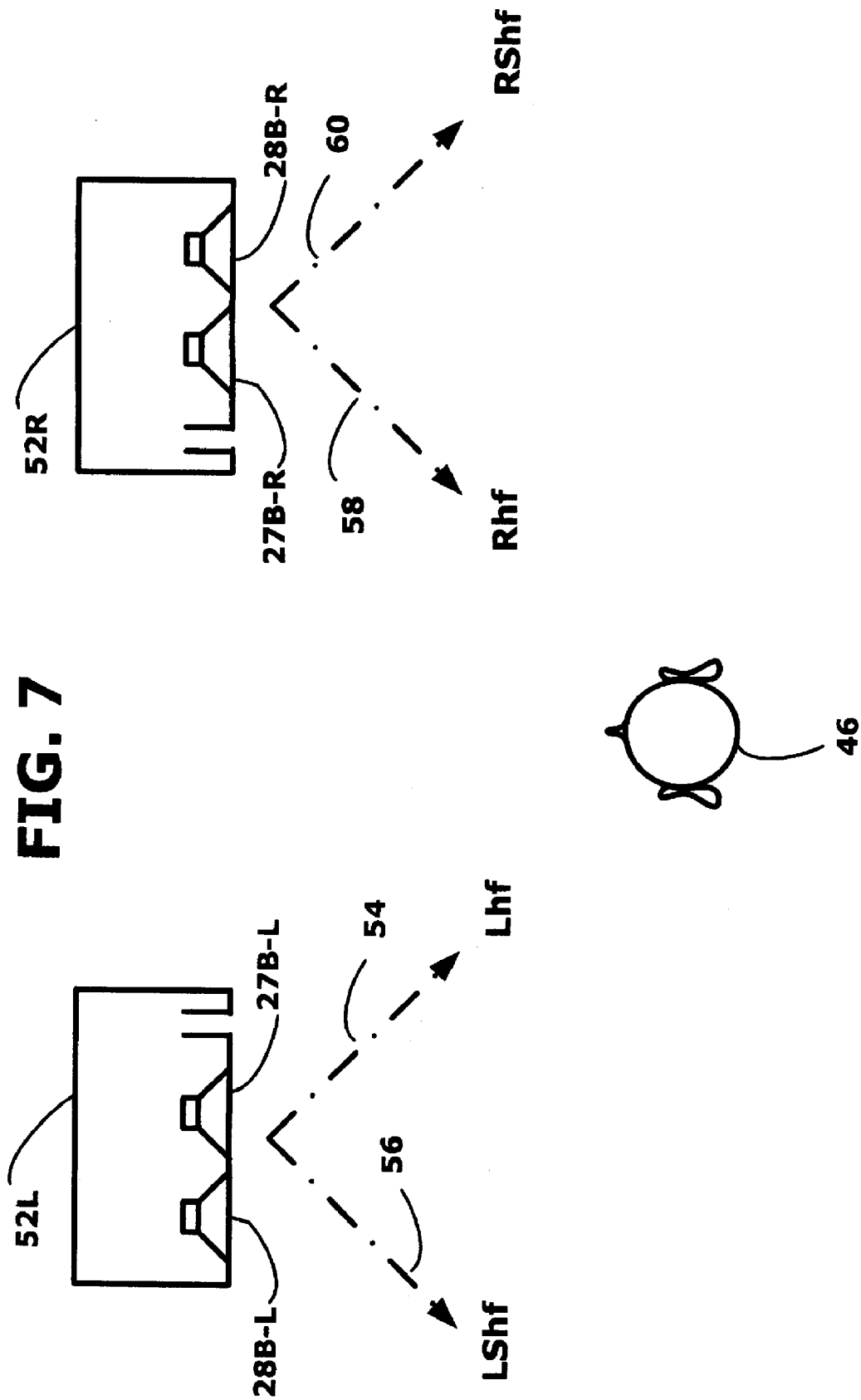

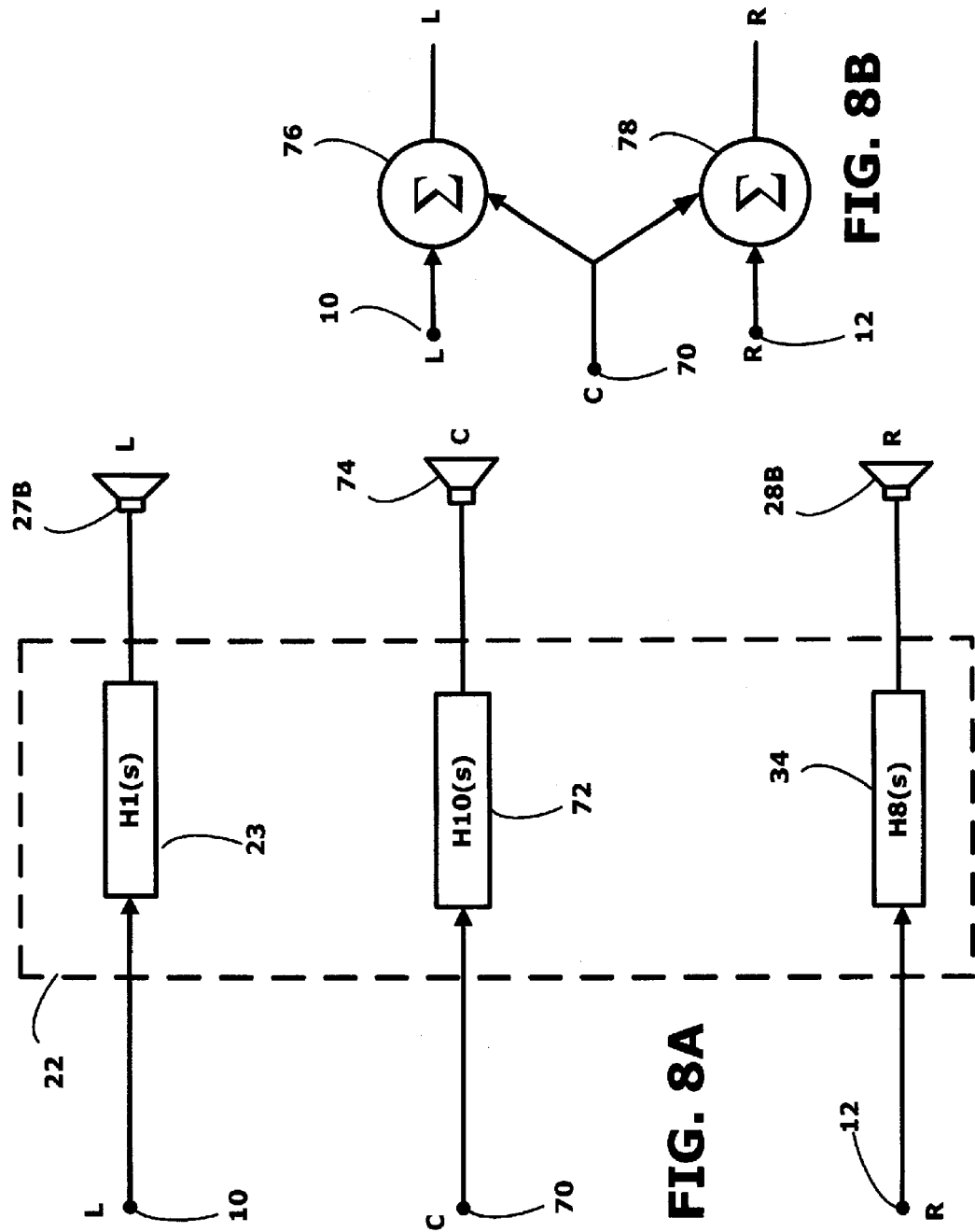

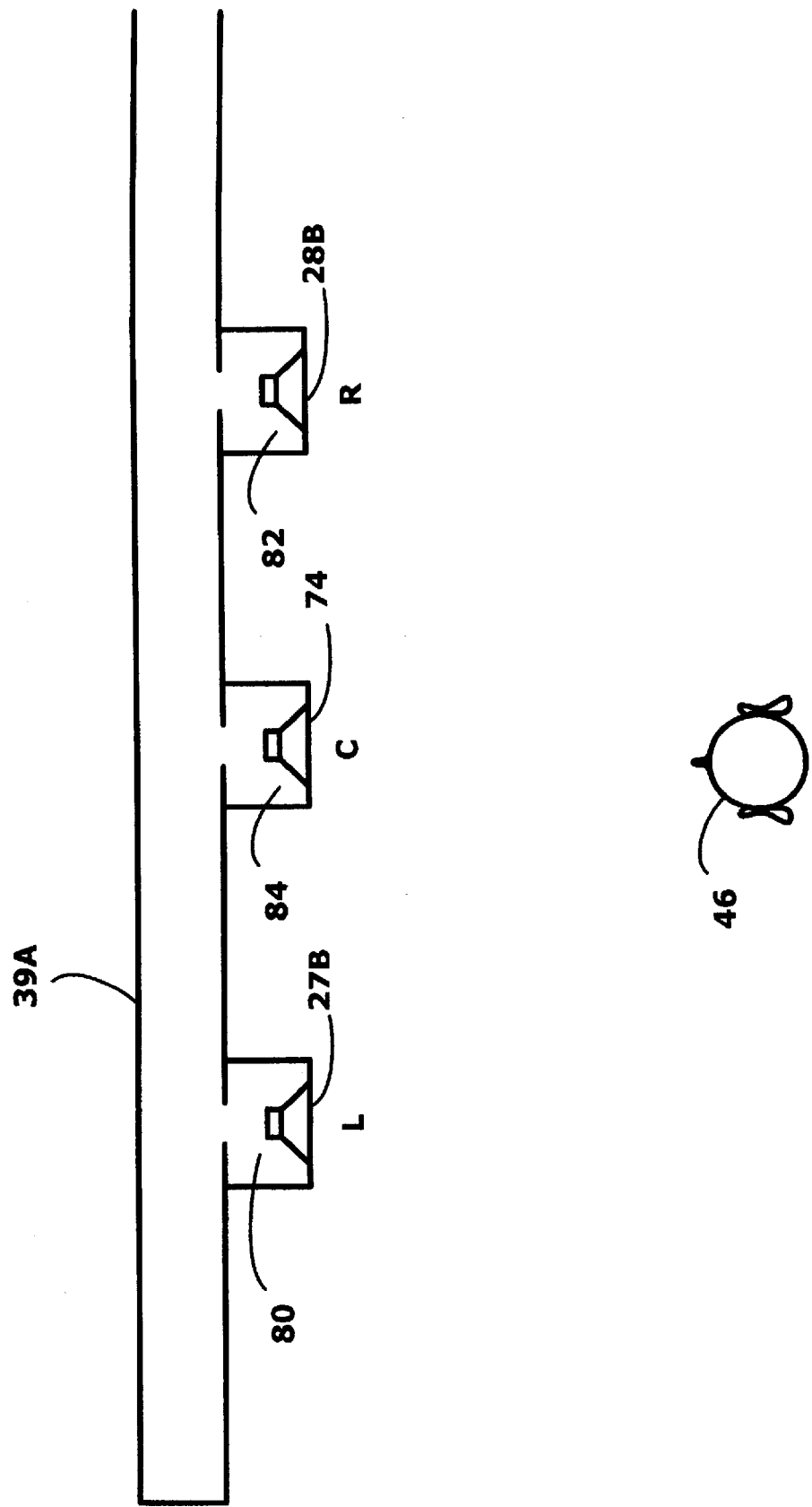

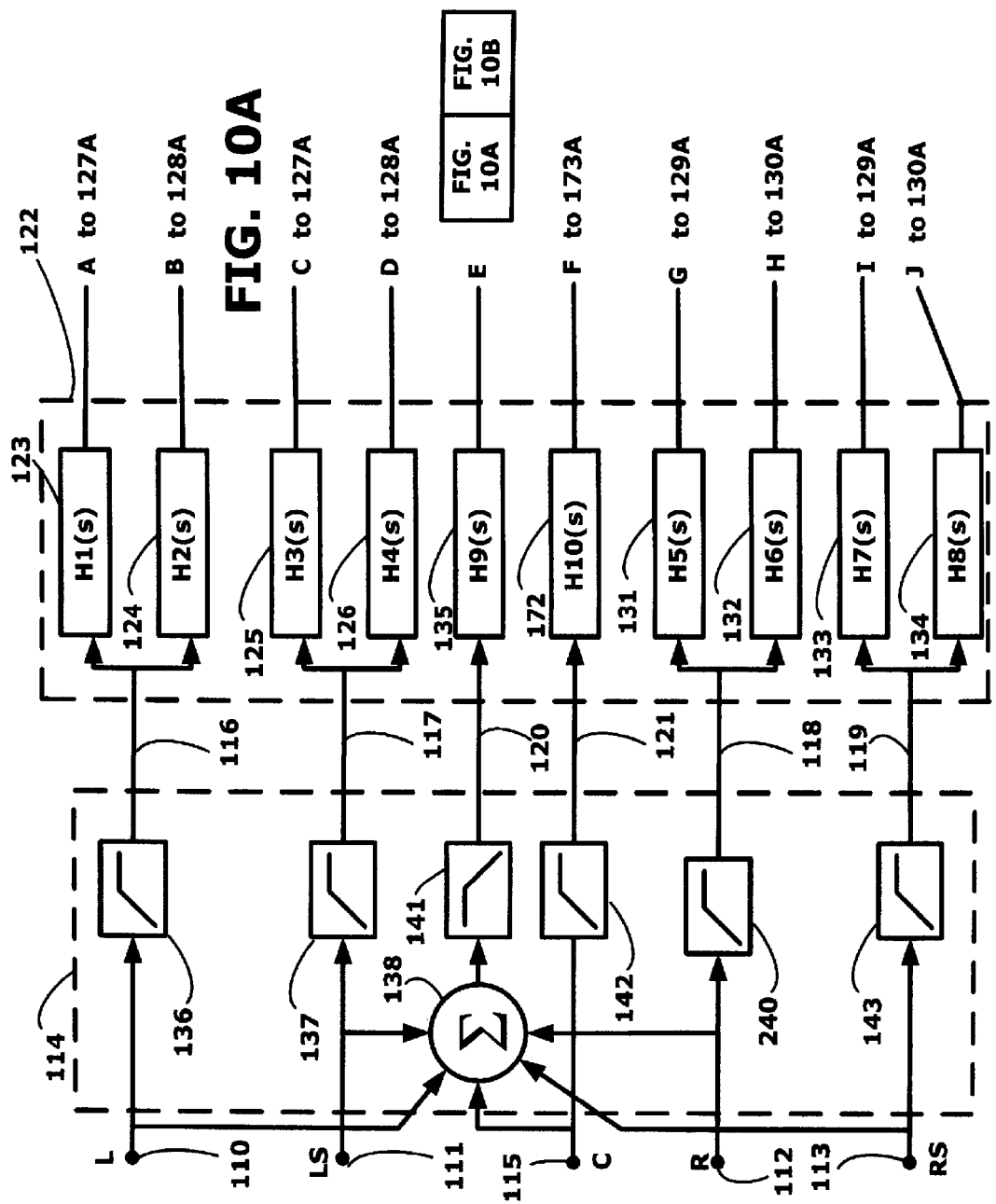

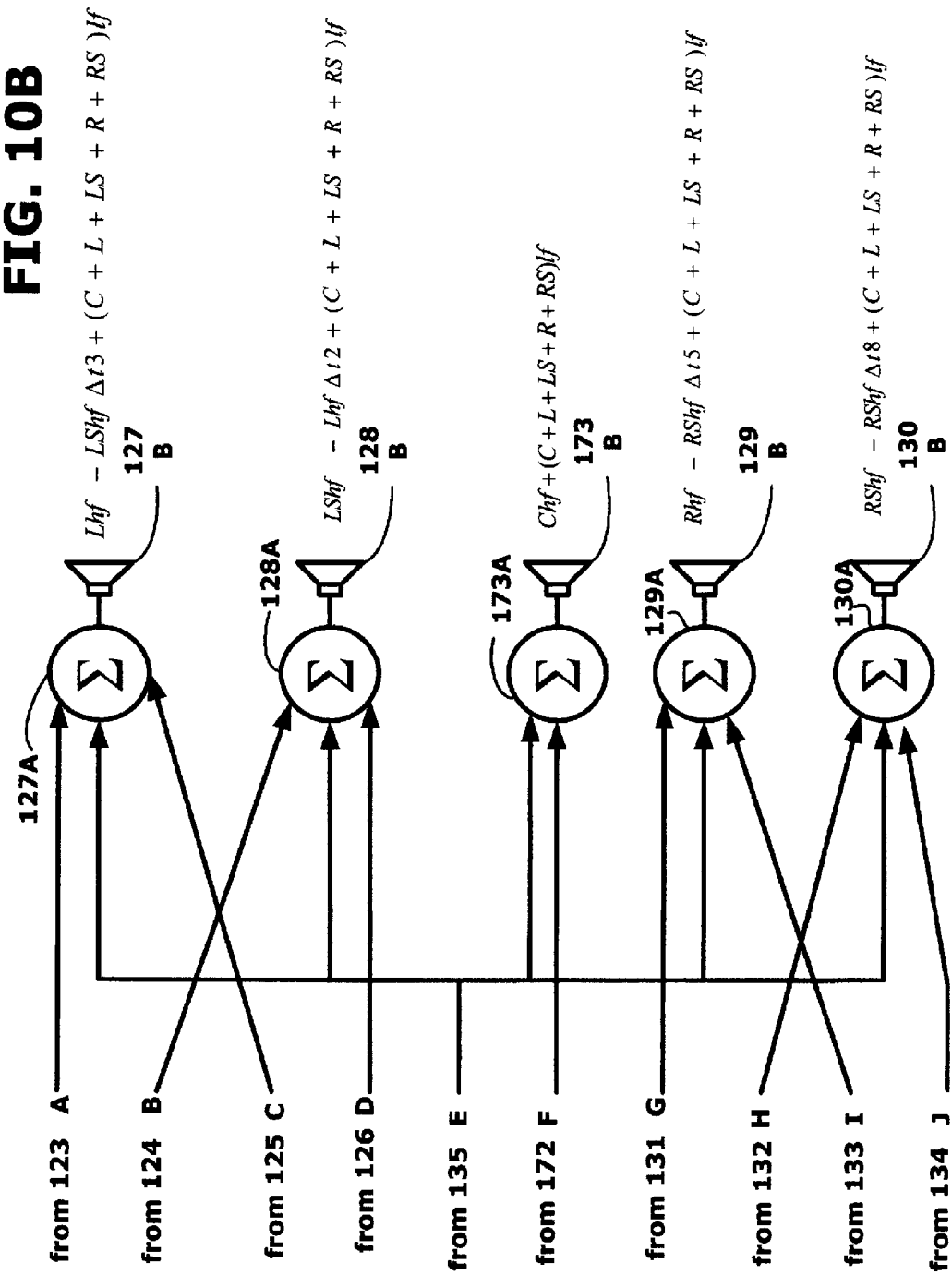

$Y = |\overline{L}| + |\overline{R}|$ $Y2 = \left(Y - \left(\dfrac{Y^2}{Y+K1}\right)\right)K2$

ELECTROACOUSTICAL TRANSDUCING WITH LOW FREQUENCY AUGMENTING DEVICES

CLAIM OF PRIORITY

This application claims priority under 35 USC §119(e) to pending U.S. patent application Ser. No. 10/383,697, filed on Mar. 7, 2003, and abandoned U.S. patent application Ser. No. 10/309,395, filed on Dec. 3, 2002, the entire contents of both of which are hereby incorporated by reference.

BACKGROUND OF THE INVENTION

The invention relates to electroacoustical transducing with low frequency augmenting devices, and more particularly to the use of directional arrays with low frequency devices, and still more particularly to the use of directional arrays with low frequency as applied to multimedia entertainment devices.

It is an important object of the invention to provide an improved method for using directional arrays with low frequency augmenting devices and integrating the directional arrays in multimedia entertainment devices, such as gambling machines and video games.

BRIEF SUMMARY OF THE INVENTION

According to the invention, a method for clipping and post-clipping processing an audio signal, includes clipping an audio signal to provide a clipped audio signal; filtering, by a first filter, the audio signal to provide a filtered unclipped audio signal; and filtering, by a second filter, the clipped audio signal to provide a filtered clipped audio signal. The method further includes differentially combining the filtered clipped audio signal and the clipped audio signal to provide a differentially combined audio signal; and combining the filtered unclipped audio signal and the differentially combined audio signal to provide an output signal.

Other features, objects, and advantages will become apparent from the following detailed description, when read in connection with the accompanying drawing in which:

BRIEF DESCRIPTION OF THE SEVERAL VIEWS OF THE DRAWING

FIG. 3B is a diagrammatic view of another implementation of the audio signal processing system of FIG. 2;

FIG. 4 is a diagrammatic view of a networked plurality of audio signal processing systems;

FIG. 5 is a diagrammatic view of an alternate implementation of the audio signal processing system of FIG. 3A;

FIG. 7 is a diagrammatic view of an implementation of the embodiment of FIG. 6;

FIG. 8A is a block diagram of another audio signal processing system embodying the invention;

FIG. 8B is a block diagram of an alternate circuit for processing a center channel signal;

FIG. 9 is a diagrammatic view of an implementation of the audio signal processing system of FIGS. 8A and 8C;

FIGS. 10A and 10B collectively are a block diagram of another audio signal processing system embodying the invention;

DETAILED DESCRIPTION

Figure 1A:
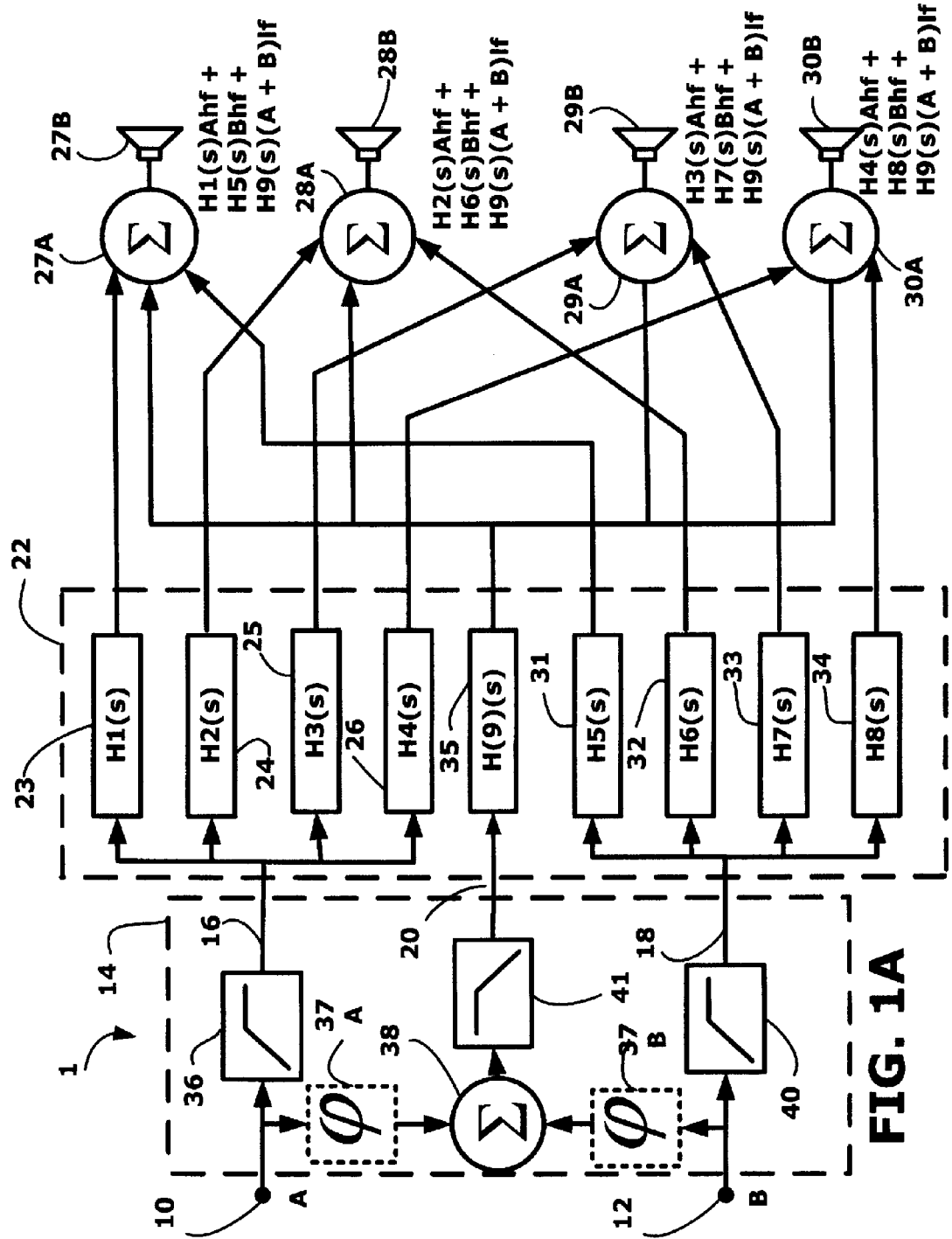
FIG. 1A is a block diagram of an audio signal processing system embodying the invention.

With reference now to the drawing and more particularly to FIG. 1A, there is shown an audio signal processing system 1 according to the invention. Input terminals 10, 12, receive audio signals corresponding to two channels A and B of a stereo or multichannel audio system. Input terminals 10 and 12 are coupled to filtering and combining circuitry 14, which outputs a modified audio signal on audio signal lines 16, 18, and 20. Audio signal line 16 is coupled to processing blocks 23-26 of audio signal processing circuitry 22. Signal processing block 23 is coupled to summer 27A, which is coupled to electroacoustical transducer 27B. Signal processing block 24 is coupled to summer 28A, which is coupled to electroacoustical transducer 28B. Signal processing block 25 is coupled to summer 29A, which is coupled to electroacoustical transducer 29B. Signal processing block 26 is coupled to summer 30A, which is coupled to electroacoustical transducer 30B. Audio signal line 18 is coupled to processing blocks 31-34 of audio signal processing circuitry 22. Signal processing block 31 is coupled to summer 27A. Signal processing block 32 is coupled to summer 28A. Signal processing block 33 is coupled to summer 29A. Signal processing block 34 is coupled to summer 30A. Audio signal line 20 is coupled to processing block 35 of audio signal processing circuitry 22. Processing block 35 is coupled to summers 27A-30A.

Combining and filtering circuitry 14 may include a high pass filter 36 coupled to input terminal 10, and a high pass filter 40, coupled to input terminal 12. Combining and filtering circuitry 14 may also include a summer 38, coupled to input terminal 10 and to input terminal 12, optionally through a phase shifter 37A or 37B, respectively. Summer 38 is coupled to low pass filter 41 which outputs to signal line 20. The characteristics and function of phase shifters 37A and 37B are described in co-pending U.S. patent application Ser.

No. 09/735,123. Phase shifters 37A and 37B have similar or different parameters, so long as they have the cumulative effect described in co-pending application U.S. patent application Ser. No. 09/735,123. over the range of frequencies in the pass band of low pass filter 41. The system of FIG. 1A may also include conventional elements, such as DACs and amplifiers, not shown in this view.

In operation, combining and filtering circuitry 14 outputs on signal line 16 a high frequency A channel signal [Ahf], on signal line 18 a high frequency B channel signal [Bhf] and on a third signal line 20 a combined low frequency signal [(A+B)lf]. The audio signal on signal line 16 is processed in processing blocks 23-26 in a manner represented by transfer functions H1(s)-H4(s) respectively (where s is the Laplace frequency variable $j\omega$ and $\omega=2\pi f$ so that H(s) is a frequency domain representation of a transfer function) and output to summers 27A-30A and then to electroacoustical transducers 27B-30B, respectively. The signal on signal line 18 is processed in processing blocks 31-34 in a manner represented by transfer functions H5(s)-H8(s), and output to summers 27A-30A and then to electroacoustical transducers 27B-30B, respectively. The signal on signal line 20 is processed in processing block 35 in a manner represented by transfer function H9(s), and output to summers 27A-30A then to electroacoustical transducers 27B-30B, respectively. A result of the processing of the system of FIG. 1A is that transducers 27B-30B each may receive signals Ahf and Bhf processed according to a different transfer function, and that transducers 27-30B each receive a combined (A+B)lf signal.

The result of the processing of the system of FIG. 1A is that transducer 27B receives a signal H1(s)Ahf+H5(s)Bhf+H9(s)(A+B)lf; transducer 28B receives a signal H2(s)Ahf+H6(s)Bhf+H9(s)(A+B)lf; transducer 29B receives a signal H3(s)Ahf+H7(s)Bhf+H9(s)(A+B)lf; and transducer 30B receives a signal H4(s)Ahf+H8(s)Bhf+H9(s)(A+B)lf. If phase 36A or 37B, or both, are present, a phase shift may be included in the signal received by the several transducers.

Transfer functions H1(s)-H9(s) may represent one or more of attenuation/amplification; time delay; phase shift; equalization, HRTF processing (as will be explained below in the discussion of FIGS. 17A and 17B) or other linear or non-linear signal processing functions. Transfer functions H1(s)-H9(s) may also represent no change (or expressed mathematically, may have a value of unity), or may be absent (or expressed mathematically, may have a value of zero); examples of these two conditions will be described below. Additionally, each of the electroacoustical transducers 27B-30B may be equalized individually, in addition to any equalization that may be done in processing blocks 23-26 and 31-35. Individual transducer equalizing is most conveniently performed by a processor associated with the individual transducers.

The system of FIG. 1A is shown as a logical block diagram. In FIG. 1A and in other logical block diagrams following, there may or may not be physical elements corresponding to each of the elements of FIG. 1A. For example, input terminals 10 and 12 can be implemented as a single physical input terminal receiving a stream of digitally encoded signals. Elements such as the high pass filters 36 and 40, or the processing blocks 23-26 and 31-35, or others, can be implemented by a digital signal processor (DSP) operating on digitally encoded data. Additionally, other circuit arrangements can produce the substantially the same result as the arrangement of FIG. 1A. For example, channels A and B may be filtered by a low pass filter such as filter 41 prior to combining. High pass filters 36 and 40 may be implemented as low pass filters with differential summation with the unfiltered signal, as shown below in FIG. 14. More than one of the blocks may be represented by a single element, or blocks may be consolidated; for example high pass filters 36 and 40 can be incorporated into the transfer functions of blocks 23-26 and 31-34 and low pass filter 41 can be incorporated into the transfer function of block 35.

"Coupled," as used herein, means "communicatingly coupled" that is, two coupled components are configured to communicate an audio signal. The coupled components may be physically connected by electrically conductive wire or by optically transmissive fiber, or may be communicatingly coupled by a wireless technique such as infrared or radio frequency (RF), or other signal communication techniques. If the elements are implemented as a DSP operating on digitally encoded signals, "coupled" means that the DSP can operate on the digitally encoded audio signals in the manner indicated by the elements and described in the associated portion of the disclosure. Similarly "signal line" as used herein, means any transmissive path, including electrically conductive wire, optically transmissive fiber, a wireless communication path, or other type of signal transmission path, for transmitting analog or digitally encoded audio signals.

"Directional," as used herein, means that at frequencies with corresponding wavelengths that are long relative to the dimensions of the radiating surface, the amplitude of the sound radiated in the direction of maximum radiation is at least 3 dB more than the amplitude of the sound radiated in the direction of minimum radiation. "Directional (or more directional) in direction X" means that the radiation level is audibly greater in direction X than in some other directions, even if direction X is not the direction of maximum radiation. A directional acoustic device typically includes a component that changes the radiation pattern of a transducer so that radiation from the transducer is more audible at some locations in space than at other locations. Two types of directional devices are wave directing devices and interference devices. A wave directing device includes barriers that cause sound waves to radiate with more amplitude in some directions than others. Wave directing devices are typically effective for radiation having a wavelength comparable to, or shorter than, the dimension of the wave directing device. Examples of wave directing devices are horns and acoustic lenses. Additionally, acoustic drivers become directional at frequencies with corresponding wavelengths that are comparable to or shorter their diameters. "Non-directional," as used herein, means that at frequencies with corresponding wavelengths that are long relative to the dimensions of the radiating surface, the amplitude of the sound radiated in the direction of maximum radiation is less than 3 dB more than the amplitude of the sound radiated in the direction of minimum radiation. "Listening space," as used herein means a portion of space typically occupied by a single listener. Examples of listening spaces include a seat in a movie theater, an easy chair, a reclining chair, or sofa seating position in a domestic entertainment room, a seating position in an vehicle passenger compartment, a single listener gambling device, or a video game playable by one person, and the like. Occasionally, more than one listener may be in a listening space, for example when two people are playing the same video game. "Listening area," as used herein means a collection of listening spaces that are acoustically contiguous, that is, not separated by an acoustical barrier.

An interference device has at least two radiating elements, which can be two acoustic drivers, or two radiating surfaces of a single acoustic driver. The two radiating elements radiate sound waves that interfere in a frequency range in which the wavelength is larger than the diameter of the radiating element. The sound waves destructively interfere more in some directions than they destructively interfere in other directions. Stated differently, the amount of destructive interference is a function of the angle relative to the midpoint between the drivers. The term "low frequency" as used herein, refers to frequencies up to about 200 Hz (which has a corresponding wavelength of 5.7 feet or 1.7 meters) or up to about 400 Hz (which has a corresponding wavelength of about 2.8 feet or 86 centimeters. "High frequency" as used herein refers to frequencies whose corresponding wavelength is above the low frequency range. For a cone type electroacoustical transducer with a cone diameter of about 4 inches, a typical high frequency range would be above about 200 Hz. "Very high frequencies" as used herein is a subset of high frequencies and refers to frequencies in the audible spectrum that have a corresponding wavelength that are less than the diameter of the transducer used to radiate them (above about 3.5 kHz for an electroacoustical transducer with a cone diameter of about 4 inches.

An audio signal processing system according to FIG. 1A is advantageous because a plurality of transducers can directionally radiate sound waves corresponding to a high frequency audio signal, using signal processing techniques to create destructive interference. Destructive interference is described more fully in U.S. Pat. No. 5,809,153 and U.S. Pat. No. 5,870,484. At the same time, the plurality of transducers can cooperatively radiate sound waves corresponding to a low frequency audio signal in the range of frequencies at which sound waves combine constructively, thereby providing more acoustic energy in the low frequency range.

Figure 1B:
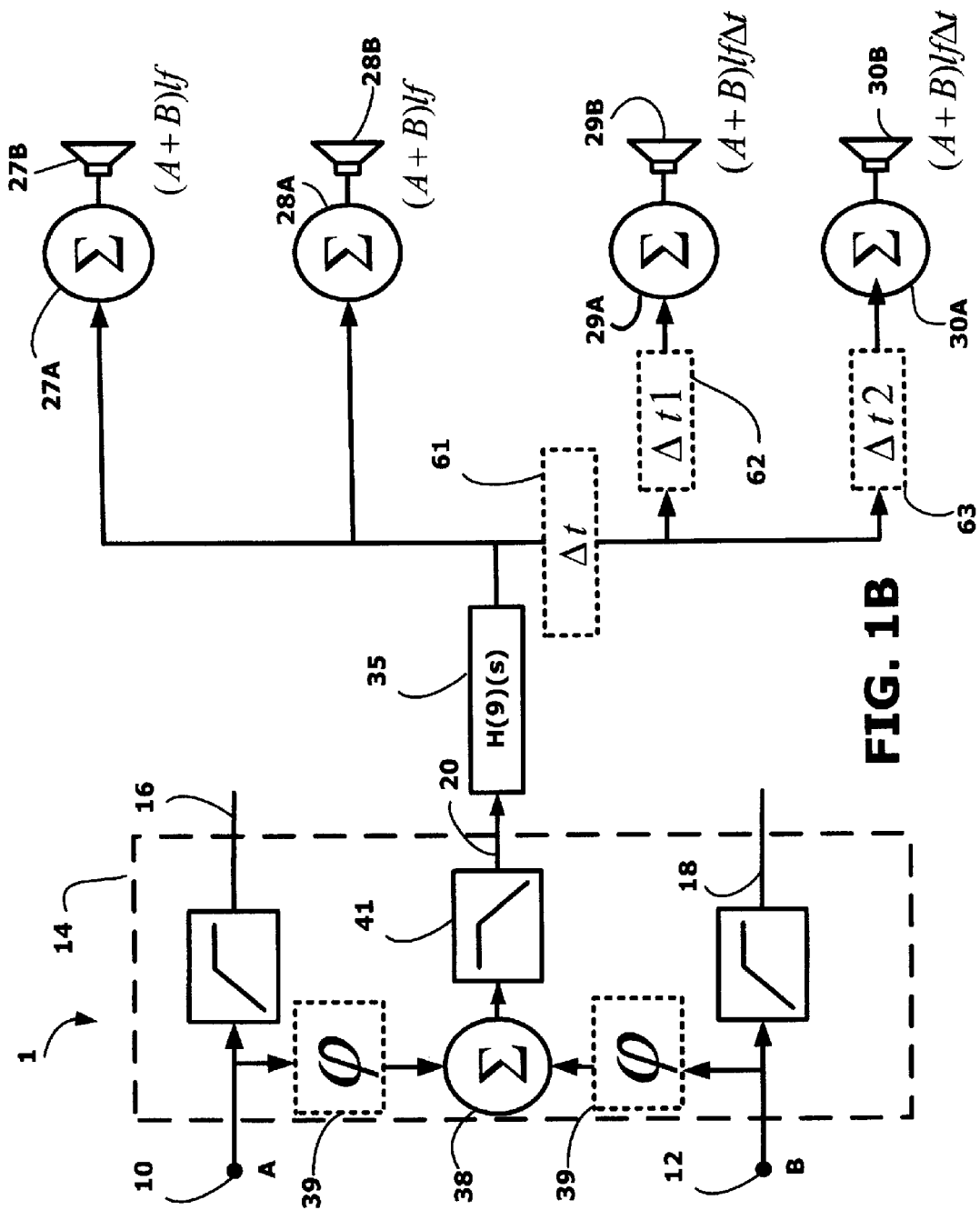
FIG. 1B is a block diagram of an alternate implementation of the audio signal processing system of FIG. 1A.

Referring to FIG. 1B, there is shown an alternate implementation of the embodiment of FIG. 1A. In FIG. 1B, a time delay is placed in the signal path between processing block 35 and one or more of the transducers. For example, processing block 35 may be coupled to summers 29A and 30A by time delay 61. Alternatively, processing block 35 may be coupled to summer 29A by time delay 62 and to summer 30A by time delay 63. Time delays similar to the delays 61, 62, and 63 can be interposed between processing block 35 and transducers 27B and 28B. Still further time delays may be incorporated in the processing blocks 23-26 and 31-34 of FIG. 1A. The time delays may be implemented as all pass filters, as complementary all pass filters, non-minimum phase filters, or as delays. The time delays can be used to create relative time differences between the signals applied to the transducers.

Figure 2:
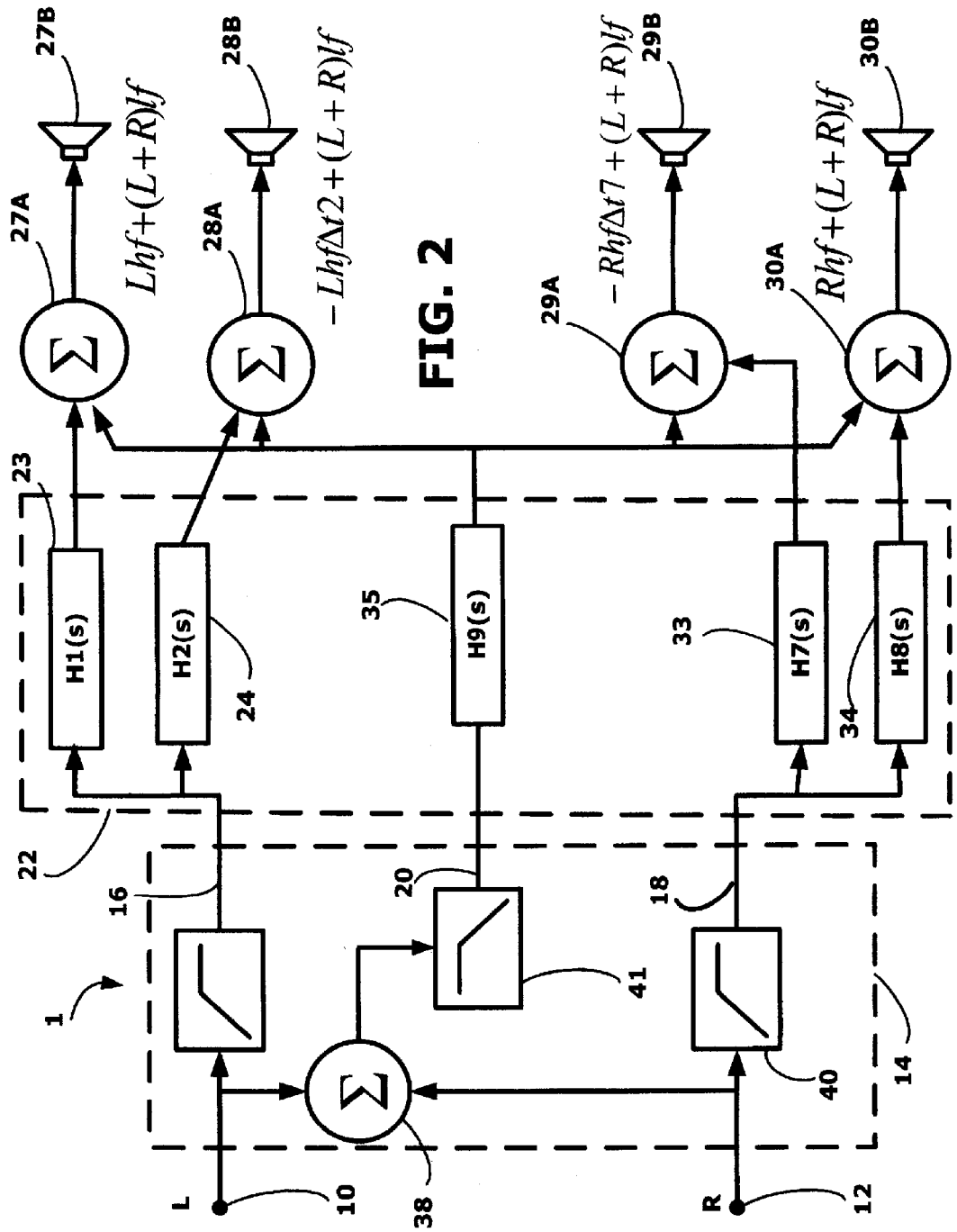
FIG. 2 is a block diagram of another alternate implementation of the audio signal processing system of FIG. 1A.

Referring now to FIG. 2, there is shown an implementation of the audio signal processing system of FIG. 1A. In the embodiment of FIG. 2, input terminals 10 and 12 represent the left (L) input terminal and the right (R) input terminal of a conventional multichannel system. Transfer function H1(s) and H8(s) in processing blocks 23 and 34, respectively, represent no change (have a value of unity); transfer functions H3(s), H4(s), H5(s), and H6(s) in processing blocks 25, 26, 31, and 32 have a value of zero and are not shown. Processing block 35, which includes transfer function H9(s) that affects the lf signal transmitted to the four transducers equally. Transfer functions H2(s) and H7(s) of processing blocks 24 and 33, respectively represent a phase inversion (denoted by a negative sign) and a time shift ($\Delta t2$ and $\Delta t7$, respectively). The result of the signal processing of the embodiment of FIG. 2 is that transducer 27B radiates sound waves corresponding to the signal combination $Lhf+(L+R)lf$; transducer 28B radiates sound waves corresponding to the signal combination $-Lhf\Delta t2+(L+R)lf$; transducer 29B radiates sound waves corresponding to the signal combination $-Rhf\Delta t7+(L+R)lf$; and transducer 30B radiates sound waves corresponding to the signal combination $Rhf+(L+R)lf$.

Figure 3A:
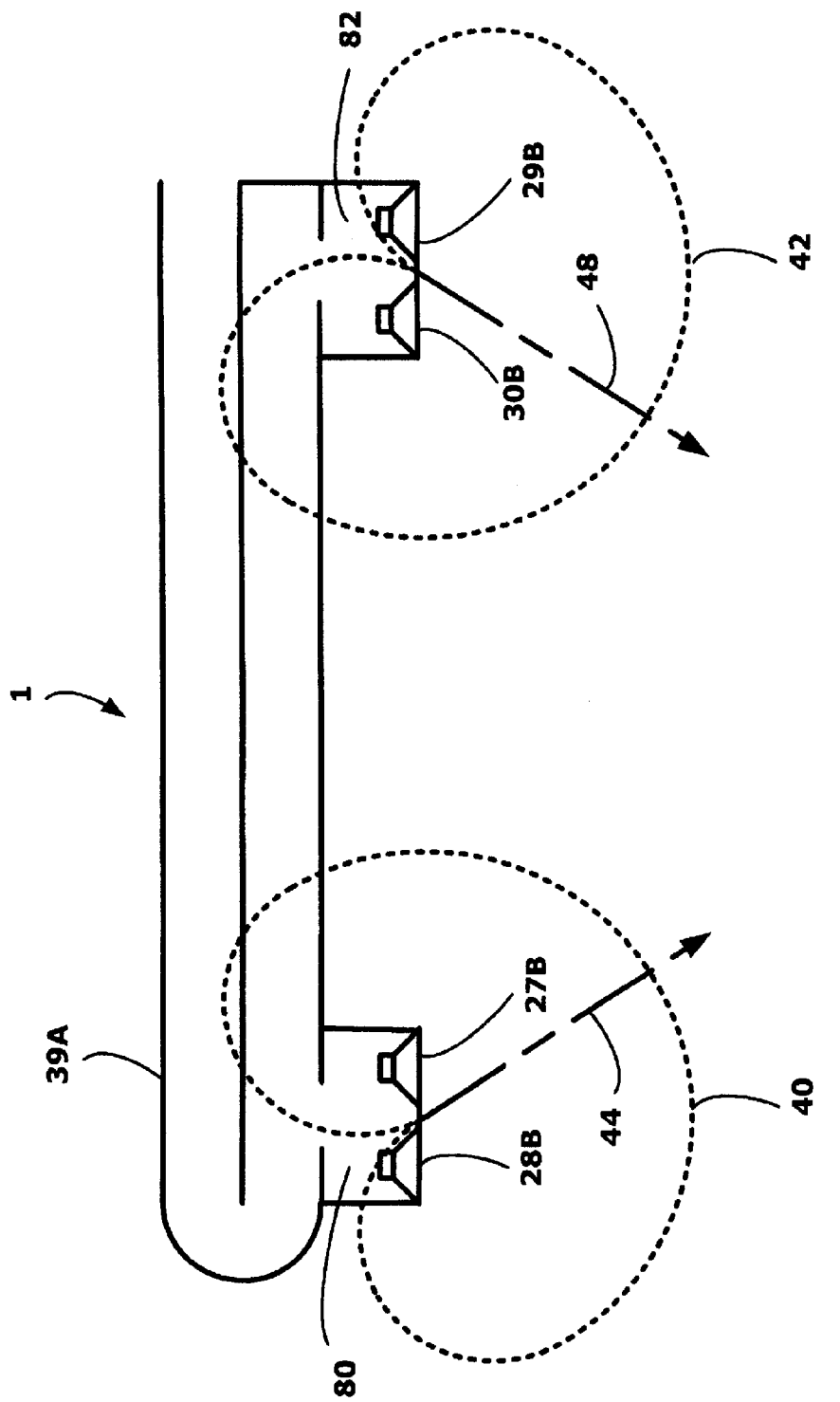
FIG. 3A is a diagrammatic view of an implementation of the audio signal processing system of FIG. 2.

Referring to FIG. 3A, there is shown a diagram of an implementation of the embodiment of FIG. 2, illustrating one use of the invention. Transducers 27B and 28B may be conventional four inch diameter cone type acoustic drivers mounted so that one radiating surface of each transducer radiates acoustic energy into a waveguide 39A either directly or through an acoustic volume 80 or some other acoustic element. The other radiating surface of each transducer radiates acoustic energy directly to the external environment. The characteristics of transfer functions H1(s) and H2(s), including time delay $\Delta t2$, and the location and orientation of transducers 27B and 28B are set so that the front surfaces of transducers 27B and 28B function as a directional array radiating sound waves corresponding to the high frequency spectral components of the left channel in a radiation pattern (such as cardioid 40) in which more acoustic energy is radiated in a direction 44 generally toward listener 46 in a listening position associated with the audio signal processing system 1 than in some other direction. Transducers 29B and may be conventional four inch diameter cone type acoustic drivers mounted so that one radiating surface of each transducer radiates acoustic energy into a waveguide 39A either directly or through an acoustic volume 82 or some other acoustic element. The other radiating surface of each transducer radiates acoustic energy directly to the external environment.

The characteristics of transfer functions H7(s) and H8(s), including time delay $\Delta t7$ and the location and orientation of transducers 29B and 30B are set so that the front surfaces of transducers 29B and 30B function as a directional array radiating sound waves corresponding to the high frequency spectral components of the right channel in a radiation pattern (such as cardioid 42) in which more acoustic energy is radiated in a direction 48 generally toward listener 46 in a listening position associated with the audio signal processing system 1. Directional arrays are discussed in more detail in U.S. Pat. Nos. 5,809,153 and 5,870,484. Sound waves radiated by the back surfaces of the cone into the waveguide, particularly low frequency sound waves augment low frequency sound waves radiated by the front surface of the cone. In this implementation of the embodiment of FIG. 2, transducers 29B and 30B are acoustically coupled to waveguide 39A near a closed end of the waveguide and transducers 27B and 28B are acoustically coupled to waveguide 39A approximately halfway between the ends of the waveguide. With the transducers positioned in this manner, the waveguide 39A and the transducers operate in a manner described in co-pending application Ser. No. 09/753,167. Acoustic volumes 80 and 82 may act as acoustic low pass filters, as described in the co-pending application Ser. No. 09/886,868. The low pass filtering effect of the volumes 80, and 82 are particularly advantageous in the present invention, because the augmenting effect of the waveguide 39A is more important at low frequencies than at high frequencies. The assembly comprising the waveguide and transducers may also include other elements to reduce high frequency resonances; such elements may include, for example, strategically positioned portions of foam. The closed-ended substantially constant cross-sectional area waveguide may be replaced by some other form of waveguide such as an open-ended waveguide or a tapered or stepped waveguide as described in U.S. patent application Ser. No. 09/146,662. The low frequency acoustic energy may be radiated non-directionally.

In a variation of the implementation of FIG. 3A, the characteristics of transfer functions H1(s)-H8(s) are set so that transducers 27B and 28B and so that transducers 29B and 30B radiate high frequency acoustic energy non-directionally. An non-directional radiation pattern can be achieved by setting transfer functions H1(s) and H2(s) so that the audio signals to transducers 27B and 28B and to transducers 29B and 30B arrive contemporaneously and in phase. In another implementation of FIG. 3A, the characteristics of transfer functions H1(s)-H8(s) may be made variable, so that transducers 27B and 28B and so that transducers 29B and 30B may have one operating mode in which the radiation pattern is directional and a second operating mode in which the radiation pattern is non-directional, or so that the transducers 29B and 30B may have one operation mode in which the radiation pattern is directional in one directional in one direction and a second operating mode in which the radiation pattern is directional in a second direction. Additionally, the transfer functions H1(s)-H8(s) may be formulated so that the directionality is incrementally or continuously variable between the two modes by making transfer functions H1(s)-H8(s) incrementally or continuously variable.

FIG. 3B shows another implementation of the embodiment of FIG. 2. In the implementation of FIG. 3B, transducer 28B is acoustically coupled to waveguide 39A near a first end of the waveguide, transducer 27B is acoustically coupled to waveguide 39A approximately one-fourth of the distance from the first end to the second end of the waveguide, transducer 30B is coupled to waveguide 39A approximately one-half the distance from the first end to the second end, and transducer 29B is coupled to waveguide 39A approximately three-fourths of the distance from the first end to the second end. By varying the geometry of the waveguide and the mounting points of the transducers, a combination of directional array behavior and waveguide behavior can be achieved. The transducers may be coupled to the waveguide by a volume, such as the volumes 84-87.

Practical considerations may make complex waveguide/transducer configurations, such as the configuration of FIG. 3B difficult to achieve. In such situations, the time delays 61-63 of FIG. 1B may be employed advantageously to change the effective position in the waveguide of one or more of the transducers.

Figure 3C:
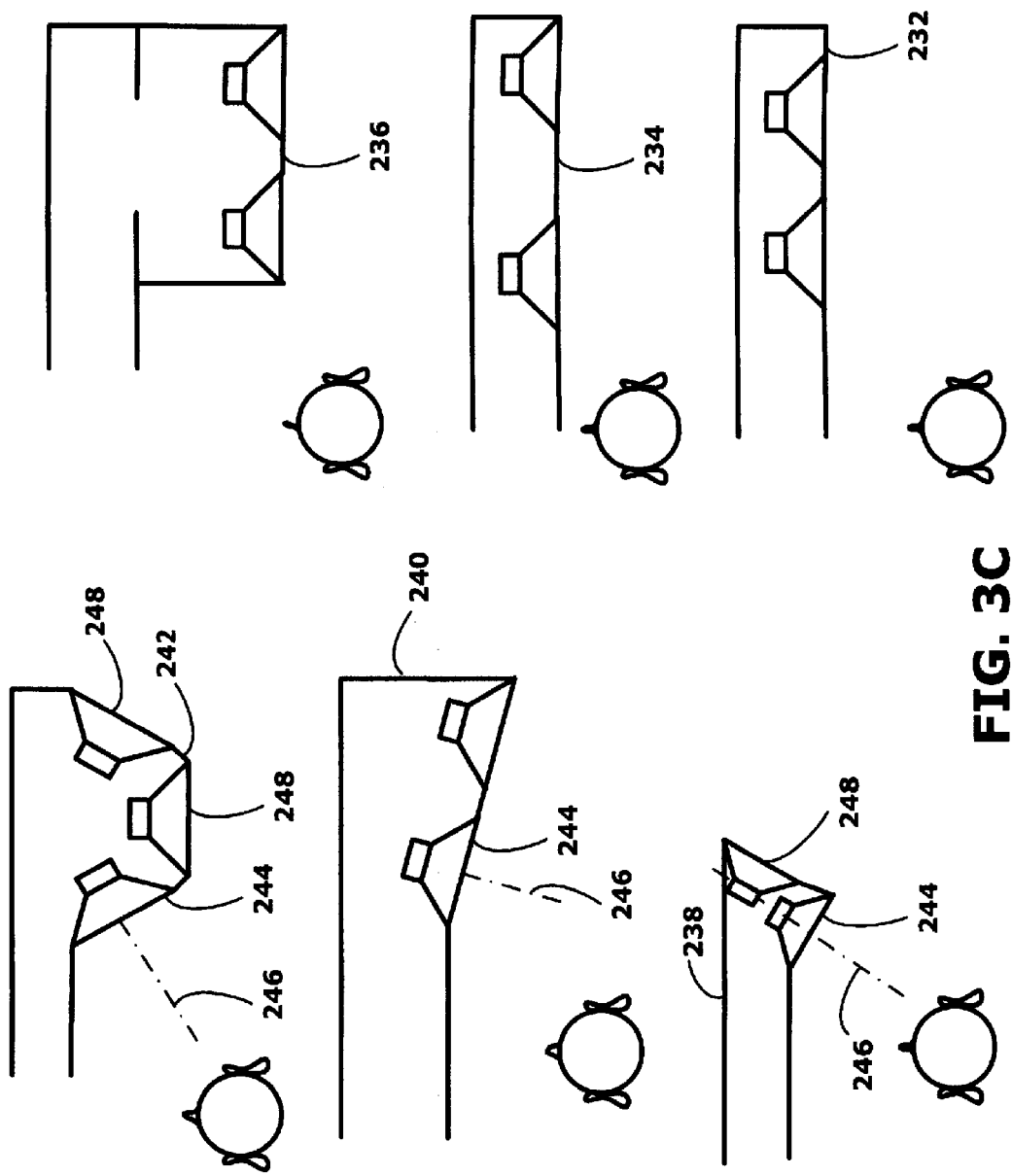
FIG. 3C is a diagrammatic view of electroacoustical transducer arrangements for use in directional arrays.

The figures that show radiation patterns are diagrammatic, and the transducer arrangement shown is not necessarily the transducer arrangement used to produce the radiation directivity pattern shown. The directivity pattern can be controlled in many ways. One way is by varying the arrangement of the transducers. Some examples of different transducer arrangements for controlling the directivity pattern are shown in FIG. 3C. The distance between the transducers can be varied, as illustrated by arrangements 232 and 234; the transducers can be acoustically coupled to the waveguide by an acoustic volume or some other acoustic element, as illustrated by arrangement 236; or the orientation of the transducers to the listening space may be varied, the orientation of the transducers to each other can be varied or additional transducers can be added as illustrated by one or more of arrangements 238, 240, and 242; and many other arrangements can be devised employing different arrangements of transducers or by combinations of the arrangements shown in FIG. 3C. The directivity pattern can also be varied by signal processing methods, such as varying the phase between the signals or varying the time of arrival of the signals at the transducers, varying the amplitude of the signals transmitted to the two transducers, varying the relative polarity of the two signals, other signal processing methods, individually or in combination. Controlling radiation directivity patterns is discussed more fully in U.S. Pat. Nos. 5,809,153 and 5,870,484.

At very high frequencies, transducers tend to become directional in the direction of the axis of the transducer surface, that is, in the direction of cone movement. For arrangements such as arrangements 238, 240, and 242, which have a transducer 244 having an axis 246 oriented generally toward the listening space associated with the audio system, additional circuitry and signal processing can roll off the signal to transducers 248 that are not oriented toward the listening space, so that at very high frequencies, sound waves are radiated only by a transducer 244 having an axis 246 oriented generally toward the listening space, providing directional radiation at very high frequencies. Alternatively, additional transducers with small radiating surfaces can be added very close to the listening space for radiating very high frequency acoustic energy at low levels so that the very high frequency sound waves are significantly more audible in the listening space associated with the audio system than in the listening space associated with adjacent listening spaces.

Referring to FIG. 4, there is shown a plurality of audio signal processing systems according to the embodiment of FIG. 3A, illustrating a contemplated use of the invention and disclosing another feature of the invention. In the diagram of FIG. 4, nine audio signal processing systems 1A-1H, each with a corresponding listener 46A-46H, are positioned in an acoustically open area. Each of the audio signal processing systems may have associated with it a video device (not shown), which together with the audio signal processing system and a user interface allows the listener to operate an interactive multimedia entertainment device. One example of multimedia entertainment devices is video games (for home or arcade use). A second class of multimedia entertainment is gambling machines (such as slot machines, bingo devices, video lottery terminals, poker machines, gambling kiosks, or gambling devices for local or wide area progressive gambling), especially gambling machines intended for a casino environment, which includes many gambling machines in an acoustically open area. Each of the audio systems 1A-1H may further have two operating modes, as described in the discussion of variations of FIG. 3A. The audio systems 1A-1D and 1F-1H operate as in mode in which transducers 27A and 28A and transducers 29A and 30A are radiating high frequency acoustic energy directionally so that the sound radiated by each audio system is significantly more audible by the listener associated with the audio system than by listeners associated with other audio systems. Audio system 1E radiates high frequency sound waves non-directionally, so that the high frequency sound waves radiated by system 1E are not significantly more audible by the listener 46 E than by listener associated with other systems. Audio signal processing systems 1A-1H may be configured to operate in the first mode during some conditions and in the second mode under other conditions, or to switch between modes on the occurrence of some event. Switching between modes may be implemented by digital signal processing or by a manual or automatic analog or digital switch or by modifying signal processing parameters. There are many methods of modifying signal processing parameters, such as manual controls, voltage controlled filters or voltage controlled amplifiers, or transfer function coefficient update or modification. Audio systems 1A-1H may be networked with each other and with a control device 2 so that the audio system may be controlled locally, by the audio system, or remotely, by the control device 2. The audio systems 1A-1E may also be networked so that the source of audio signals can be remote, local, or some remote and some local. In the FIG. 4, audio system 1E may be operating, in response to a condition or to the occurrence of an event, in a mode so that the array including transducers 27A and 28A and the array including transducers 29A and 30A are radiating high frequency acoustic energy non-directionally. For example, in a video arcade implementation, the audio system may operate in the directional mode under normal conditions, and switch, for a predetermined period of time, to the non-directional mode if a player has reached some level of achievement. In a gaming room implementation, the audio system may operate in the directional mode under normal conditions, and switch, for a predetermined period of time, to the non-directional mode in the event a player hits a "jackpot," thereby providing excitement and encouragement to all listeners in the vicinity of audio system 1E.

An embodiment of the invention is particularly advantageous in a gambling casino environment. It is desirable to place as many machines as possible in a space, it is desirable for each machine to produce a sufficient level of sound to maintain excitement, and it is desirable for the acoustic energy radiated by each machine to be more audible in the listening space associated with a device than in listening spaces associated with adjacent devices.

In another implementation, the directivity pattern may be made continuously or incrementally variable between directional and non-directional, or continuously or incremental between radiating directionally in one direction, and radiating directionally in another direction. A method for providing continuously directional or incrementally variable directivity is shown below in FIG. 16 and the corresponding portion of the disclosure.

Referring to FIG. 5, there is shown a diagram of an alternate implementation of the embodiment of FIG. 3A. Corresponding reference numerals in FIG. 5 refer to like-numbered elements of FIG. 3. In the implementation of FIG. 5, the transducers 27B, 28B, 29B, and 30B are mounted in an enclosure 39B having a port 50. Transducers 27B and 28B are cone type acoustic drivers mounted so that one cone surface radiates sound waves into the ported enclosure and one cone surface radiates sound waves into free air. The value of the time delay Δt2 of FIG. 2, the characteristics of transfer functions H1(s) and H2(s) (of FIG. 2), and the location and orientation of transducers 27B and 28B are set so that the front surfaces of transducers 27B and 28B function as a directional array radiating sound waves corresponding to the high frequency spectral components of the left channel in a radiation pattern (such as cardioid 40) that is directional in a direction 44 generally oriented toward listener 46 in a listening position associated with the audio signal processing system 1. The value of the time delay Δt7, the characteristics of transfer functions H7(s) and H8(s), and the location and orientation of transducers 29B and 30B are set so that the front surfaces of transducers 29B and 30B function as a directional array radiating sound waves corresponding to the high frequency spectral components of the right channel in a radiation pattern (such as cardioid 42) that is directional in a direction 48 generally oriented toward listener 46 in a listening position associated with the audio signal processing system 1. Sound waves radiated by the back surfaces of the cone into the ported enclosure, particularly low frequency sound waves, augment low frequency sound waves radiated by the front surface of the cone.

Figure 6:
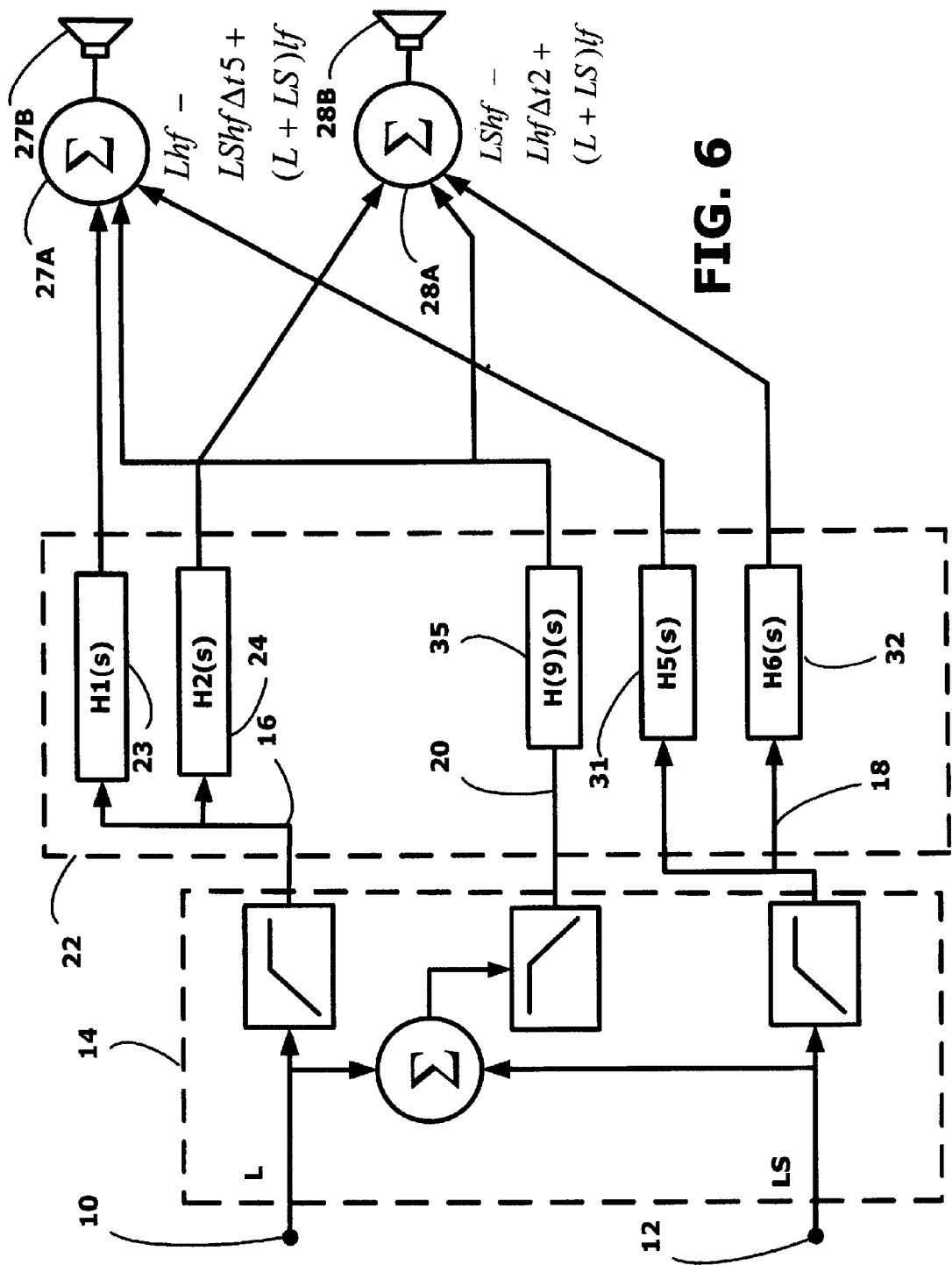
FIG. 6 is a block diagram of another audio signal processing system embodying the invention.

Referring now to FIG. 6, there is shown another embodiment of the invention. In the embodiment of FIG. 6, input terminals represent the left and left surround input terminals of a surround sound system. Transfer function H1(s) and H6(s) represent no change (have a mathematical value of unity); transfer functions H3(s), H4(s), H7(s), and H8(s), in processing blocks 25, 26, 33, and 34 (of FIG. 1A) are not present (have a mathematical value of zero) and are not shown. Transfer function H9(s) of processing block 35 affects the lf signal transmitted to the transducers equally. Transfer functions H2(s) and H5(s) represent a phase inversion (denoted by the negative sign) and a time shift (Δt2 and Δt5). The result of the signal processing of the embodiment of FIG. 2 is that transducer 27B radiates sound waves corresponding to the signal combination Lhf-LShfΔt5+(L+LS)lf and transducer 28B radiates sound waves corresponding to the signal combination LShf−LhfΔt2+(L+LS)lf. There may be a like audio signal processing system for the right and right surround channels.

Referring now to FIG. 7, there is shown a diagram of an implementation of the embodiment of FIG. 6. In the embodiment of FIG. 7, transducers 27B-L (the "L" denoting the left/left surround audio signal processing system) and 28B-L are mounted in a ported enclosure 52L. The ported enclosure is configured to augment the low frequency sound waves radiated by transducers 27B-L and 28B-L. The spacing of the transducers and the value of Δt2 is set so that sound waves corresponding to the Lhf signal is radiated directionally toward listener 46 as indicated by arrow 54. The spacing of the transducers and the value of Δt5 is set so that sound waves corresponding the LShf signal is radiated directionally in a direction 56 not toward the listener so that the sound waves reach the listener after reflecting off room boundaries and objects in the room. Similarly, transducers 27B-R (the "R" denoting the right/right surround audio signal processing system) and 28B-R are mounted in a ported enclosure 52R. The ported enclosure is configured to augment the low frequency sound waves radiated by transducers 27B-R and 28B-R. The spacing of the transducers and the value of Δt2 is set so that sound waves corresponding to the Rhf signal is radiated directionally toward listener 46 as indicated by arrow 58. The spacing of the transducers and the value of Δt5 is set so that sound waves corresponding the RShf signal is radiated directionally in a direction not toward the listener so that the sound waves reach the listener after reflecting off room boundaries and objects in the room. In other implementations of FIG. 6, such as the implementation of FIG. 4, the signal processing, transducer spacing, and the value of Δt2 and Δt5 are set so that sound waves corresponding to both the L and LS signals and both the R and RS signals are radiated toward the listening space occupied by listener 46. If there is a center channel, the center channel may be radiated by a single centrally positioned transducer, by an assembly similar to the devices shown in FIG. 7, or the center channel may be downmixed, as shown below in FIG. 8B.

Referring to FIG. 8A there is shown another embodiment of the invention. In the embodiment of FIG. 8, input terminals 10 and 12 may represent the input terminals of a conventional stereo audio system or the L and R input terminals of a conventional multichannel audio system. Also included may be a center channel input terminal 70, which could be the center channel of a multichannel audio system. In the embodiment of FIG. 8A, the high frequency and low frequency spectral components of the audio signals are not separated, so the combining and filtering circuitry and the summers of other embodiments is not required. Input terminal 10 is coupled to electroacoustical transducer 27B through processing block 23. Input terminal 12 is coupled to electroacoustical transducer 28B through processing block 34. Input terminal 70 is coupled to electroacoustical transducer 74 through processing block 72. Transfer functions H1(s) (applied to the L signal in processing block 23), H8(s) (applied to the R signal in processing block 34) and H10(s) (applied to the C signal in processing block 72) may include functions such as individual channel equalization, individual equalization of transducers to account for room effects, volume or balance control, image spreading, or other similar functions, or may represent no change. Sound waves corresponding to the full range left channel signal are radiated by transducer 27B, sound waves corresponding to the full range right signal are radiated by transducer 28B, and sound waves corresponding to the full range center audio signal are radiated by transducer 74. More detail of this embodiment is shown in FIG. 9.

FIG. 8B shows an alternate processing circuit for processing a center channel signal. In the system of 8B, the center channel may be downmixed at summers 76 and 78 into the left and right channels. The downmixing may include a scaling of the center channel signal, and can be done according to conventional techniques.

Figure 8C:
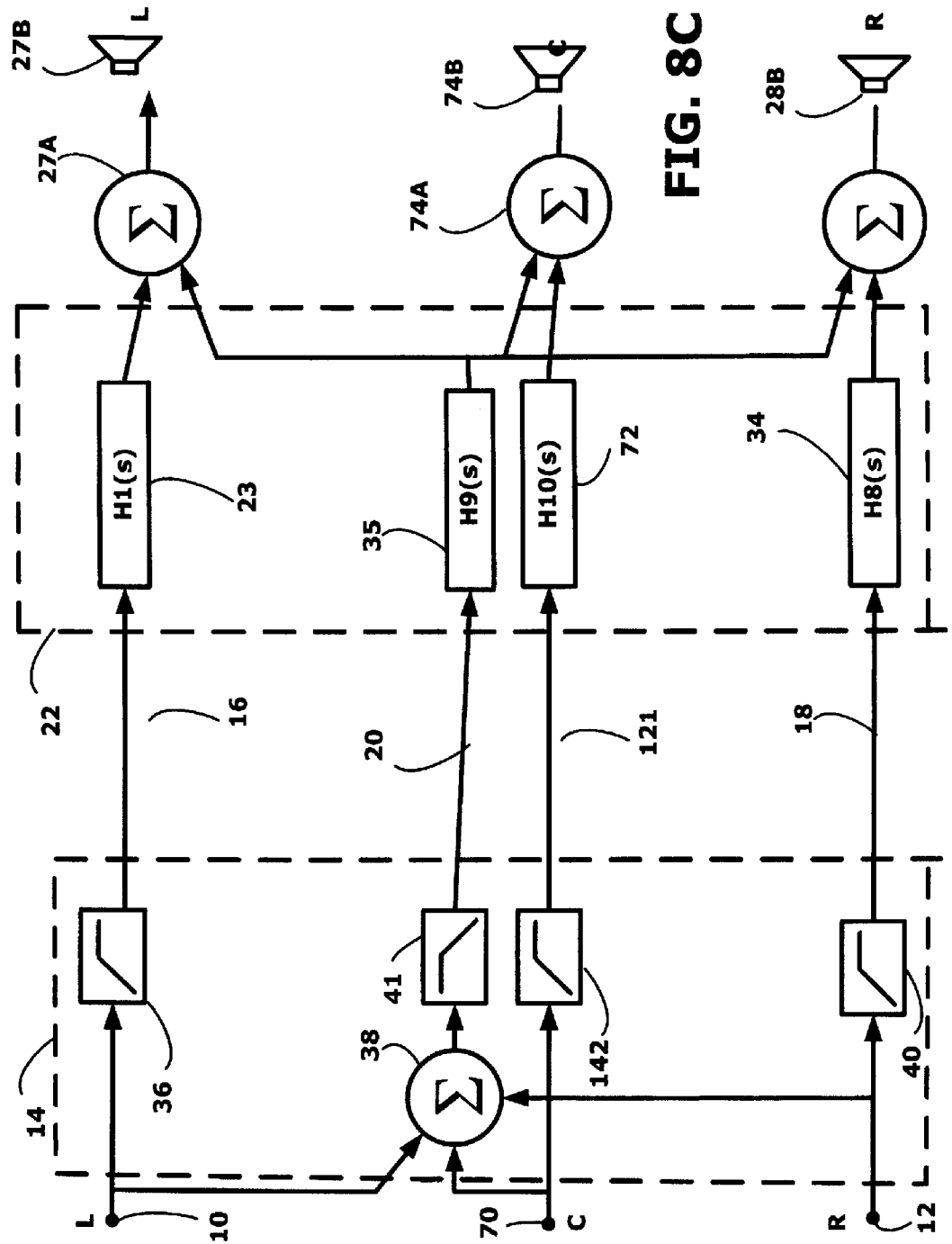
FIG. 8C is a block diagram of an alternate implementation of the embodiment of FIG. 8A.

FIG. 8C show an alternate embodiment of FIG. 8A. The implementation of FIG. 8C contains the elements of FIG. 8A, plus additional circuitry to process a low frequency signal, such as the combining and filtering circuitry 14 coupling the input terminals 10 and 12. Combining and filtering circuitry 14 includes the summer 38, the low pass filter 41, the high pass filters 36 and 40 and the signal lines 16, 18, and 20 of FIGS. 1, 2, and 6. Additionally, the implementation of FIG. 8A may includes phase shifters such as the phase shifters 37A and 37B (not shown in this view) of previous embodiments coupling the input terminals 10, 12, and 70 with summer 38 and a high pass filter 142 for the center channel signal. If present, the relative phase applied by the phase shifters can be set so that the signals from input terminals 10, 12, and 70 combine in the proper phase relationship. Summers 27A, 28A, and 74A couple elements of the audio signal processing circuitry 22 with transducers 27B, 28B, and 74B for the left, right, and center channels, respectively. The embodiment of FIG. 8C functions as the embodiment of FIG. 8A, except that the bass portions of the three channels' signals are combined and transmitted to each of the transducers.

Referring now to FIG. 9, there is shown an implementation of the embodiments of FIGS. 8A and 8C. In the embodiment of FIG. 9, transducers 27B, 28B, and 74 are positioned in a waveguide 39A so that one side of the cone of each of the transducers faces the external environment and so that the other side of the cone of each of the transducers is acoustically coupled to the waveguide. In this embodiment, the transducers may be acoustically coupled to the waveguide by acoustic volumes 80, 82, and 84, according to the principles described above in the discussions of FIGS. 3A and 3B. The transducers may be coupled to the waveguide 39A at approximately one-fourth, one-half, and three-fourths of the distance between the two ends of the waveguide as shown, or at other positions, selected empirically or by simulation, that alleviate undesirable resonance effects of the waveguide.

Referring to FIGS. 10A and 10B, there is shown another embodiment of the invention. Input terminals 110-113 and 115, receive audio signals corresponding, respectively, to the left, left surround, right, right surround, and center channels of a surround audio system. Input terminals 110-113 and 115 are coupled to combining and filtering circuitry 114, which outputs on a first signal line 116 a high frequency L signal (Lhf), on a second signal line 117 a high frequency LS signal (LShf), on signal line 118 a high frequency R signal (Rhf), on signal line 119 a high frequency RS signal (RShf), on signal line 121 a high frequency C signal (Chf), and on signal line 120 a combined low frequency signal (C+L+LS+R+RS)lf. The signals on signal lines 116-121 are processed by processing circuitry 122. The signal on signal line 116 is processed in a manner represented by transfer functions H1(s) and H2(s) in processing blocks 123 and 124, and output to summers 127A and 128A and then to electroacoustical transducers 127B-128B, respectively. The signal on signal line 117 is processed in a manner represented by transfer functions H3(s) and H4(s) in processing blocks 125 and 126, and output to summers 127A and 128A and then to electroacoustical transducers 127B and 128B, respectively. The signal on signal line 118 is processed in a manner represented by transfer functions H5(s) and H6(s) in processing blocks 131 and 132, and output to summers 129A and 130A and then to electroacoustical transducers 129B and 130B, respectively. The signal on signal line 119 is processed in a manner represented by transfer functions H7(s) and H8(s) in processing blocks 133 and 134, and output to summers 129A and 130A and then to electroacoustical transducers 129B and 130B, respectively. The signal on signal line 120 is processed in a manner represented by transfer function H9(s) in processing block 135, and output to summers 127A-130A and 173A and then to transducers 127B-130B and 173B. The signal on signal line 121 is processed in a manner represented by transfer function H10(s) in processing block 172, and output to summer 173A and then to electroacoustical transducer 173B. A result of the processing of the system of FIGS. 10A and 10B is that transducers 127B and 128B may receive signals Lhf and LShf processed according to different transfer functions; transducers 129B and 130B may receive signals Rhf and RShf processed according to different transfer functions; transducer 173B may receive a processed Chf channel signal; and that transducers 127B-130B and 173B each receive a combined (C+L+LS+R+RS)lf signal processed according to the same transfer function.

As with the embodiment of FIG. 1A, an optional phase shifter such as elements 37A and 37B of FIG. 1A may be used when any combination of Llf, LSlf, Rlf, and RSlf are combined to provide a phase relationship that causes the signals combine appropriately. If the audio system does not have a discrete center channel transducer 173B, the center channel signal may be downmixed, as shown in FIG. 8B.

One topology for implementing the combining and filtering circuitry 114 is shown in FIGS. 10A and 10B. Input terminal 110 is coupled to high pass filter 136 and to summer 138. Input terminal 111 is coupled to high pass filter 137 and to summer 138. Input terminal 112 is coupled to high pass filter 240 and to summer 138. Input terminal 113 is coupled to high pass filter 143 and to summer 138. The coupling to the summer 138 from any one of the terminals may be through a phase shifter such as phase shifters 37A or 37B as shown in FIG. 1A. Summer 138 is coupled to low pass filter 141 which outputs to signal line 120. Other filter topologies may produce substantially the same result; for example, the channels may be low pass filtered prior to their combining, or the high pass filters may be implemented as low pass filters with differential summation with the unfiltered signal, as shown below in FIG. 14. Transfer functions H1(s)-H10(s) may represent one or more of attenuation/amplification; time delay; phase shift; equalization, or other acoustic signal processing functions. Transfer functions H1(s)-H9(s) may also represent no change (or expressed mathematically, have a value of unity), or may be absent (or expressed mathematically, have a value of zero); examples of these two conditions will be described below. The system of FIGS. 10A and 1013 may also include conventional elements, such as DACs and amplifiers, not shown in this view. Additionally, each of the electroacoustical transducers 27B-30B may be equalized individually, in addition to any equalization that may be done in processing blocks 23-26 and 31-35. In FIGS. 10A and 10B, other topologies may provide the same result. For example, low pass filter 141 positioned between summer 138 and signal line 120 may be replaced by a low pass filter between each of the input terminals and summer 138.

In one implementation of the invention, transfer functions H1(s), H4(s), H6(s), and H7(s) represent no change (mathematically, a value of unity) and transfer functions H2(s), H3(s), H5(S), and H8(s) represent a phase inversion (represented by a negative sign) and a time delay (represented by $\Delta tn$, where n is 2, 3, 6, and 7, respectively).

Looked at from the point of view of the electroacoustical transducers, transducer 127B receives a combined signal Lhf−LShf$\Delta$t3+(L+LS+R+RS+C)lf; transducer 128B receives a combined signal LShf−Lhf$\Delta$t2+(L+LS+R+RS+C) lf; transducer 129B receives combined signal RShf−Rhf$\Delta$t5+ (L+LS+R+RS+C)lf; transducer 130B receives combined signal Rhf−RShf$\Delta$t8+(L+LS+R+RS+C)lf; and transducer 173B received combined signal Chf+(C+L+LS+RS)lf.

Figure 11:
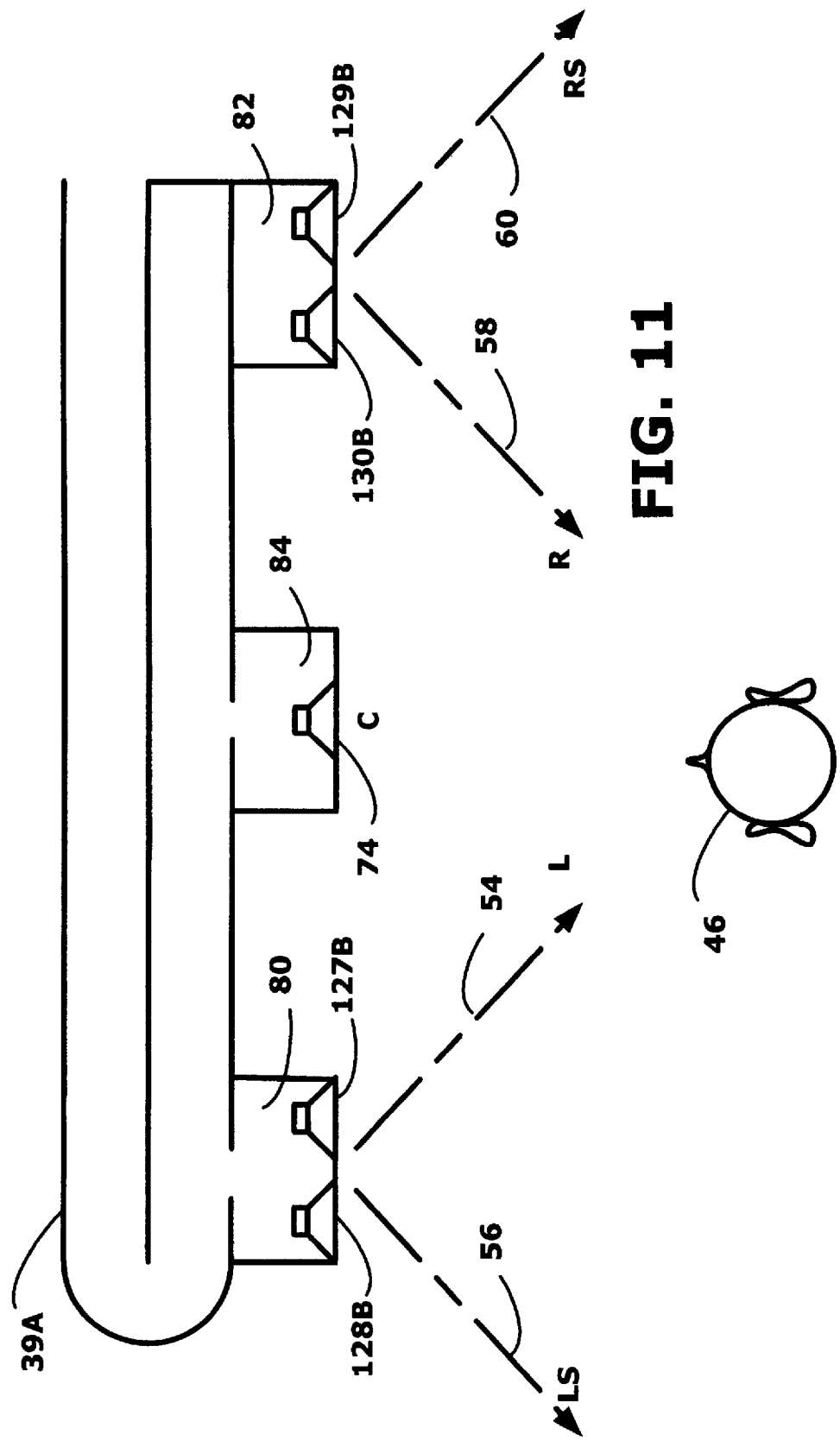
FIG. 11 is a diagrammatic view of an implementation of the audio signal processing system of FIGS. 10A and 10B

Referring to FIG. 11, there is shown a diagram of an implementation of the embodiment of FIGS. 10A and 10B. The value of the time delay $\Delta t2$, the characteristics of transfer functions H1(s) and H2(s), and the location and orientation of transducers 127B and 128B are set so that the front surfaces of transducers 127B and 128B function as a directional array radiating sound waves corresponding to the high frequency spectral components of the left channel in a radiation pattern that is directional in a direction 54 generally toward listener 46 in a listening position associated with the audio signal processing system 1. The value of the time delay $\Delta t3$, the characteristics of transfer functions H3(s) and H4(s), and the location and orientation of transducers 127B and 128B are set so that the front surfaces of transducers 127B and 128B function as a directional array radiating sound wave corresponding to the high frequency spectral components of the left surround channel in a radiation pattern that is directional in a direction 56 in this instance outwardly, different from direction 54. Alternatively, the value of the time delay $\Delta t3$, the characteristics of transfer functions H3(s) and H4(s), and the location and orientation of transducers 127B and 128B can be set so that the front surfaces of transducers 127B and 128B function as a directional array radiating sound wave corresponding to the high frequency spectral components of the left surround channel in a radiation pattern that is directional in direction 54, in this instance inwardly. The value of the time delay $\Delta t6$, the characteristics of transfer functions H5(s) and H6(s), and the location and orientation of transducers 129B and 130B are set so that the front surfaces of transducers 129B and 130B function as a directional array radiating sound waves corresponding to the high frequency spectral components of the right channel in a radiation pattern that is directional in a direction 58 generally toward listener 46 in a listening position associated with the audio signal processing system 1. The value of the time delay $\Delta t7$, the characteristics of transfer functions H7(s) and H8(s), and the location and orientation of transducers 129B and 130B are set so that the front surfaces of transducers 129B and 130B function as a directional array radiating sound waves corresponding to the high frequency spectral components of the right surround channel in a radiation pattern that is directional in a direction 60 in this instance outwardly different from direction 58. Alternatively, the value of the time delay $\Delta t7$, the characteristics of transfer functions H7(s) and H8(s), and the location and orientation of transducers 129B and 130B can be set so that the front surfaces of transducers 129B and 130B function as a directional array radiating sound waves corresponding to the high frequency spectral components of the right surround channel in a radiation pattern that is directional in direction 58, in this instance inwardly.

Directional arrays are discussed in more detail in U.S. Pat. Nos. 5,809,153 and 5,870,484. Sound waves radiated by the back surfaces of the cones into the waveguide, particularly low frequency sound waves augment low frequency sound waves radiated by the front surfaces of the cones. In this implementation of the embodiment of FIG. 11, transducers 129B and 130B are positioned near the closed end of the waveguide and transducers 127B and 128B are positioned approximately halfway between the ends of the waveguide. With the transducers positioned in this manner, the waveguide 139A and the transducers operate in a manner described in co-pending U.S. patent application Ser. No. 09/753,167. The assembly comprising the waveguide and transducers may also include elements to reduce high frequency resonances; such elements may include, for example, strategically positioned portions of foam.

In addition to the directivity directions shown in FIG. 11, the presentation mode signal processing methodology of co-pending U.S. patent application Ser. No. 09/886/868 can be used to create different combinations of directivity patterns of the L, LS, R, and RS channels.

Figure 12:
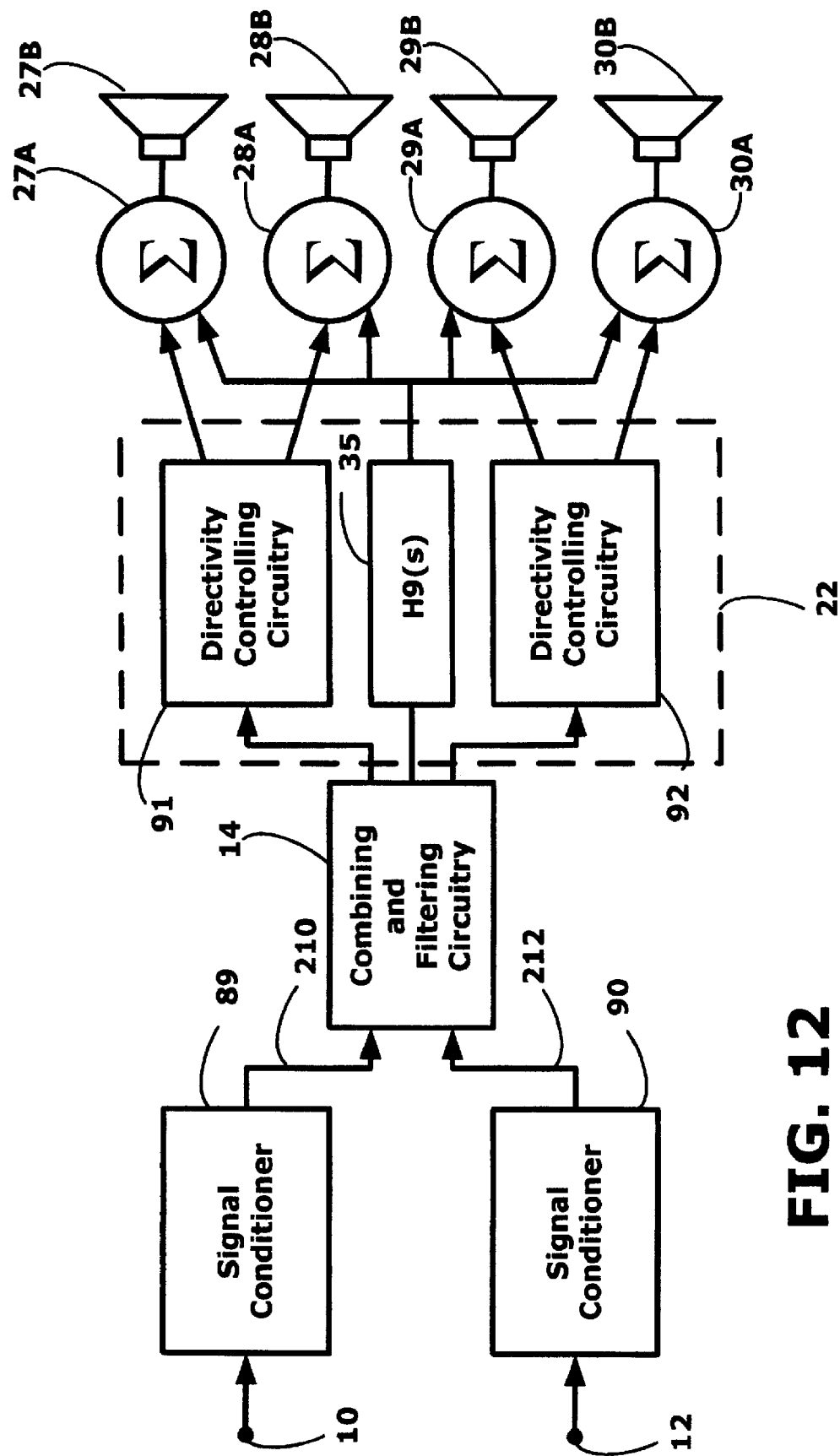
FIG. 12 is a block diagram of an audio processing system including alternate configuration of some of the elements of previous figures and showing some additional features of the invention.

Referring now to FIG. 12, there is shown an audio system including alternate configurations of combining and filtering circuitry 114 and audio processing circuitry 122 and including additional features of the invention. Input terminal 10 is coupled to a signal conditioner 89, which is coupled by signal line 210 to combining and filtering circuitry 14. Input terminal 12 is coupled to a signal conditioner 90, which is coupled by signal line 212 to combining and filtering circuitry 14. Combining and filtering circuitry 14 is coupled to directivity control circuitry 91 of audio signal processing circuitry 22. Directivity control circuitry 91 is coupled to signal summers 27A and 28A, each of which is in turn coupled to a corresponding electroacoustical transducer 27B, 28B. Combining and filtering circuitry 14 is also coupled to directivity control circuitry 92 of audio signal processing circuitry 22. Directivity control circuitry 92 is coupled to signal summers 29A and 30A, each of which is in turn coupled to a corresponding electroacoustical transducer 29B, 30B. Combining and filtering circuitry 14 is also coupled to processing block 35 of audio signal processing circuitry 22, which is in turn coupled to signal summers 27A-30A, each of which is in turn coupled to electroacoustical transducers 27B-30B.

More detail about the elements of FIG. 12 and a description of the operation of the elements of FIG. 12 can be found in the discussion of FIGS. 13-16.

Figure 13A:
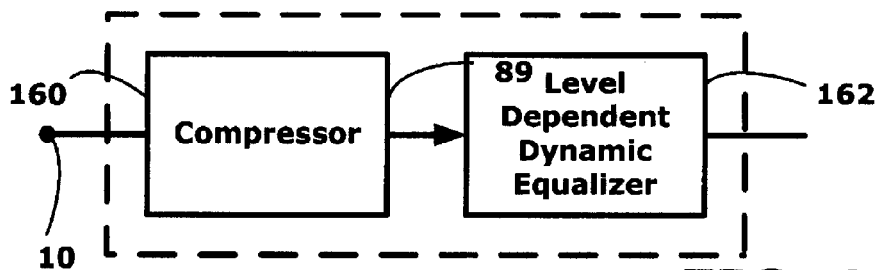
FIGS. 13A-13C are block diagrams showing more detail of some of the elements of FIG. 12.
Figure 13B:
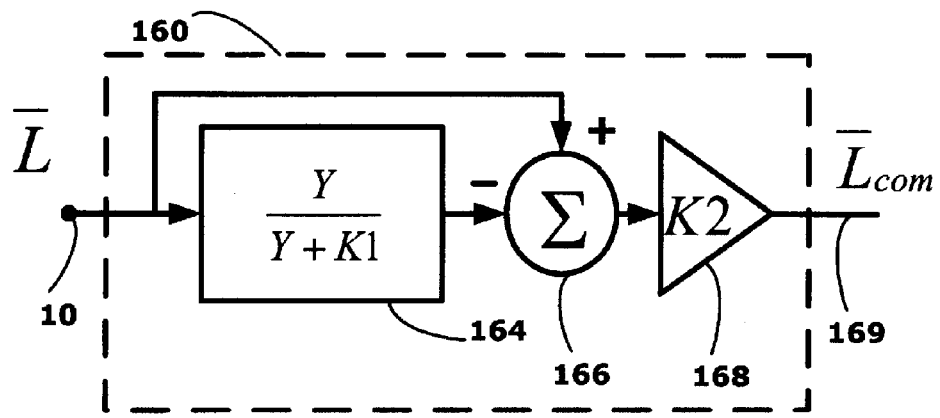
Figure 13C:
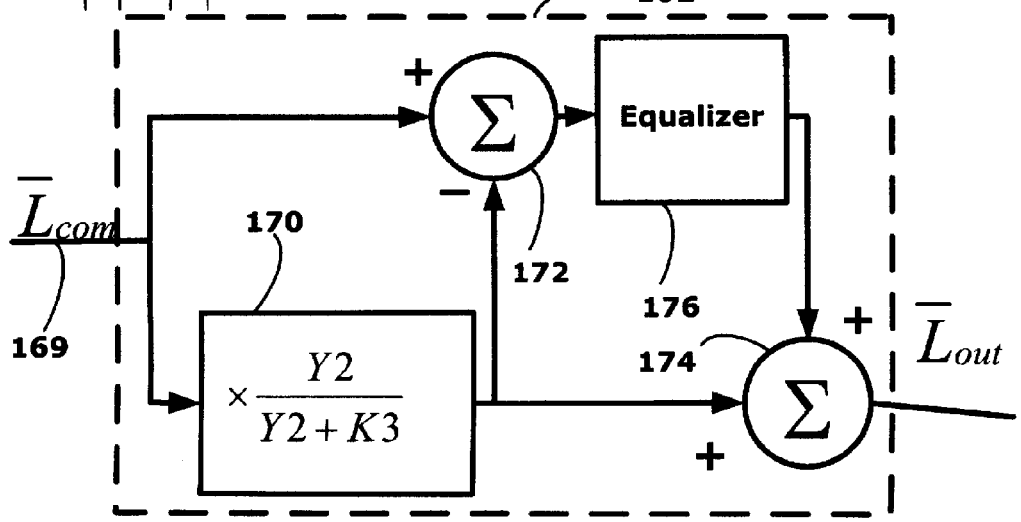

Referring now to FIGS. 13A-13C, there is shown signal conditioner 89 in more detail. Signal conditioner 89 includes signal compressor 160 and level dependent dynamic equalizer 162. Compressor 160 includes multiplier 164, which is coupled to input terminal 10 and differentially to summer 166. Input terminal 10 is also coupled to summer 166. Summer 166 is coupled to amplifier 168, which is coupled to the signal line 169 to the level dependent dynamic equalizer 162. Level dependent dynamic equalizer 162 includes an input signal line that is coupled to multiplier 170 and to summer 172. Multiplier 170 is coupled differentially to summer 172 and to summer 174. Summer 172 is coupled to equalizer 176, which is coupled to summer 174.

The operation of the signal conditioner 89 will be described by way of an example, in which input terminal 10 is the left terminal of a stereo or multichannel system, in which L and R are the left and right channel signals, respectively, and in which $\overline{L}$ and $\overline{R}$ are the amplitudes of the left and right channel signals, respectively. The system can also be applied to other combinations of channels, such as surround channels. In operation, multiplier 164 of compressor 160 applies a coefficient, or attenuation factor, of $$\frac{Y}{Y+K1}$$

to the input signal, where $Y=|\overline{L}|+|\overline{R}|$ and K1 is a constant whose value depends on the degree of dynamic range compression desired. A typical value for K1 is in the range of 0.09. Summer 166 differentially sums the output signal of multiplier 164 with the input signal so that the signal applied to amplifier 168 is compressed by an amount determined by the value of the coefficient $$\frac{Y}{Y+K1}.$$

The amplitude $\overline{L}$ of the input signal L is effectively attenuated by a factor of $$\left(1-\frac{Y}{Y+K1}\right)$$

and amplified by a factor K2 to provide the amplitude $\overline{L}_{com}$ of the compressed signal, so that the amplitude $\overline{L}_{com}$ of the compressed signal is $$K2\left(1-\frac{Y}{Y+K1}\right)\overline{L}.$$

The expression $$\left(1-\frac{Y}{Y+K1}\right)$$

reduces to $$\frac{K1}{Y+K1},$$

so the amplitude $\overline{L}_{com}$ of the compressed signal is also described by $$K2\left(\frac{K1}{Y+K1}\right)\overline{L}.$$

The compressed signal with the amplitude $$L_{com}=K2\left(1-\frac{Y}{Y+K1}\right)\overline{L}$$

is transmitted to level dependent dynamic equalizer 162.

If the values of $|\overline{L}|$ and $|\overline{R}|$ are large relative to K1, the value of $$\frac{Y}{Y+K1}$$

approaches one, and the value of $$\left(1-\frac{Y}{Y+K1}\right)$$

approaches zero, so the signal is significantly compressed. If the values of $|\overline{L}|$ and $|\overline{R}|$ are small, the value of $$\left(1-\frac{Y}{Y+K1}\right)$$

approaches one, and the signal is compressed very little. A typical value for the gain K2 of the amplifier is 5.

Multiplier 170 of level dependent dynamic equalizer 162 applies a coefficient of $$\frac{Y2}{Y2+K3},$$

where K3 is a constant that is related to the amount of dynamic equalization that is to be applied to the audio signal and $$Y2=\left(Y-\left(\frac{Y^2}{Y+K1}\right)\right)K2$$

which can be expressed as $$Y2=\left(\frac{YK1}{Y+K1}\right)K2.$$

A typical value for K3 is 0.025. Summer 172 differentially combines the output signal from multiplier 170 with the compressed signal $L_{com}$ so that the signal that is output from summer 172 is effectively attenuated by a factor of $$\left(1-\frac{Y2}{Y2+K3}\right).$$

The signal from summer 172 is then equalized by equalizer 176 and combined at summer 174 with the unequalized output of multiplier 170 so that the output signal of signal conditioner 89 is formed by combining an unequalized signal that has been attenuated by a factor of $$\frac{Y2}{Y2+K3}$$

with a signal that has been attenuated by an equalization coefficient of $$\left(1 - \frac{Y2}{Y2 + K3}\right)$$

and equalized. For large values of Y2 the value of the equalization coefficient approaches zero, and the equalization is applied to a small proportion of the signal. For small values of Y2, the value of the coefficient approaches one, and the equalization is applied to a large proportion of the input signal.

Signal conditioner 90 may have elements corresponding to the elements of signal conditioner 89, arranged in substantially the same way and performing substantially the same function in a substantially similar manner.

Figure 14:
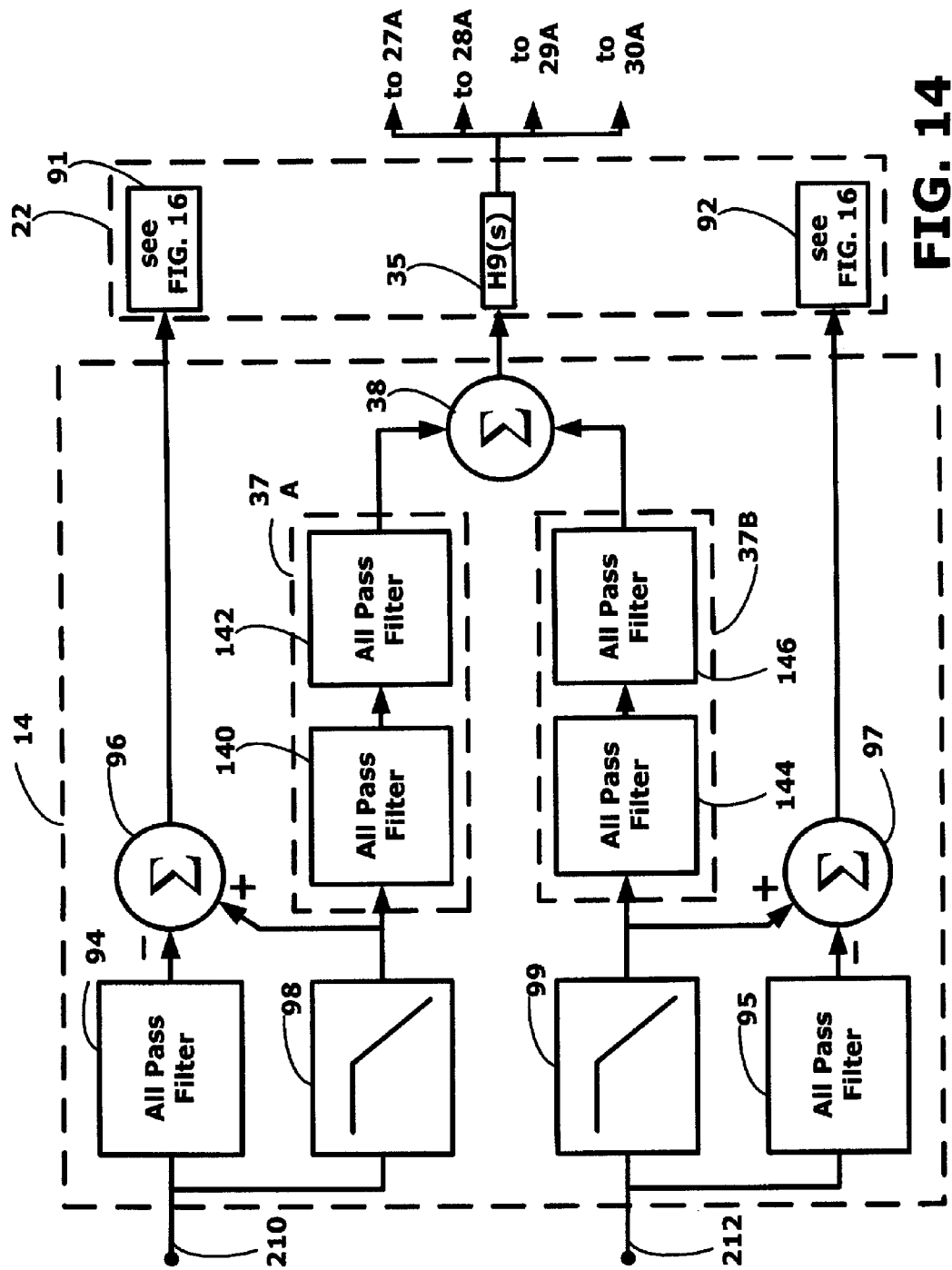
FIG. 14 is a block diagram showing more detail of another of the elements of FIG. 12.

FIG. 14 shows the combining and filtering circuitry 14 of FIG. 12 in more detail. Signal line 210 is coupled to all pass filter 94, which is coupled differentially to summer 96. Signal line 210 is also coupled to low pass filter 98, which is coupled to all pass filter 140 and coupled to summer 96. Summer 96 is coupled to signal processing block 91 of audio signal processing circuitry 22. All pass filter 140 of phase shifter 37A is coupled to all pass filter 142 of phase shifter 37A. All pass filter 142 is coupled to summer 38. Signal line 212 is coupled to all pass filter 95, which is coupled differentially to summer 97. Summer 97 is coupled to signal processing block 92 of audio signal processing circuitry 22. Signal line 212 is also coupled to low pass filter 99, which is coupled to all pass filter 144 and coupled to summer 97. All pass filter 144 of phase shifter 37B is coupled to all pass filter 146 of phase shifter 37B. All pass filter 146 is coupled to summer 38. Summer 38 is coupled to signal processing block 35 of audio signal processing circuitry 22.

The characteristics of the all pass filters in are shown in the following table:

| Filter | Poles | Zeroes |
| --- | --- | --- |
| 140 | −8 | 8 |
| 142 | −133 | 133 |
| 144 | −37 | 37 |
| 146 | −589 | 589 |
| 94, 95 | −400 | 400 |

Phase shifters 37A and 37B may be implemented as two all pass filters as shown, or may be implemented as more or fewer than two all pass filters, depending on the range of frequencies over which the relative phase difference is desired. The filter may have different singularities than those listed in the table. Low pass filters 98 and 99 may be second order low pass filters with a break frequency at about 200 Hz. Other break frequencies and other filter orders may be used, depending on the transducers used and on signal processing considerations. Signal blocks 91 and 92 will be described in FIG. 16.

Low pass filters 98 and 99, phase shifters 37A and 37B, and summer 38 perform a similar function to the low pass filter 41, phase shifters 37A and 37B and summer 38 of FIGS. 1A and 1B, except the signals are low pass filtered prior to their combining. The combination of low pass filter 98 and summer 96 and the combination of low pass filter 99 and summer 97 perform a function similar to the high pass filters 36 and 40 respectively of FIGS. 1A and 1B. All pass filters 94 and 95 provide the proper phase alignment when the high frequency signals are combined in subsequent stages of the device.

Figure 15A:
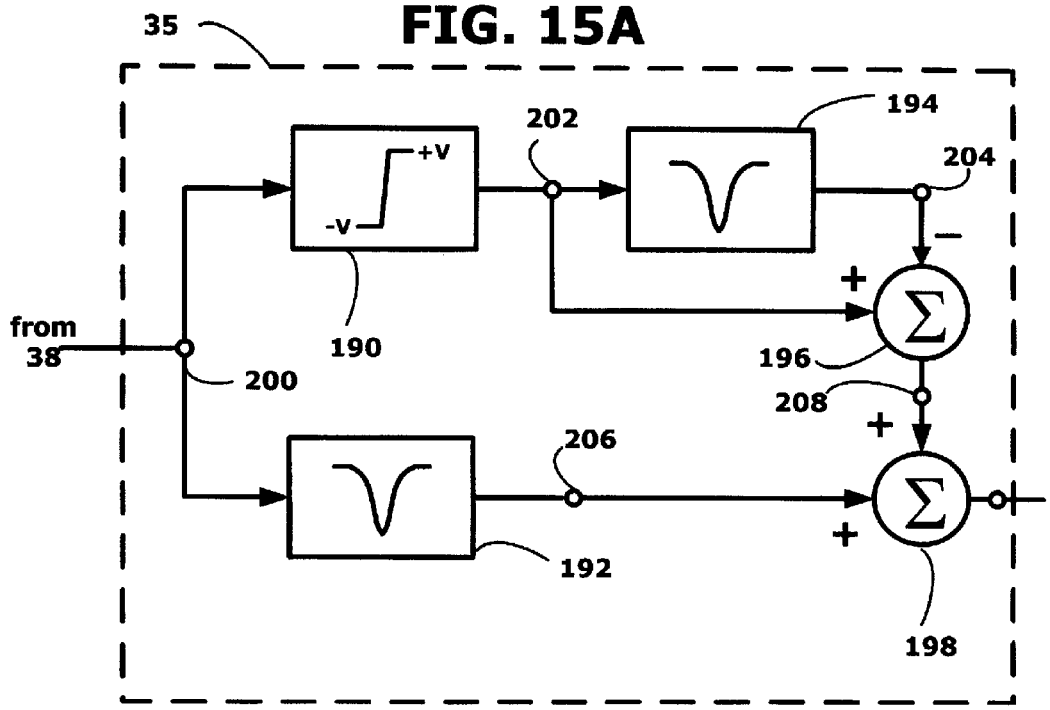
FIGS. 15A and 15B are block diagrams of another of the elements of FIG. 12.

Referring to FIG. 15A, there is shown in greater detail processing block 35 of the embodiment of FIG. 12. The signal line from summer 38 is coupled to clipper 190 and to notch filter 192. The output terminal of clipper 190 is coupled to notch filter 194 and summer 196. The output terminal of notch filter 194 is coupled differentially to summer 196. The output terminal of summer 196 and the output terminal of notch filter 192 are coupled to summer 198. For explanatory purpose, some nodes are identified in FIG. 15A. Node 200 is on the signal line between the input terminal and clipper 190 and between the input terminal and notch filter 192. Node 202 is on the signal line between the clipper 190 and the notch filter 192 and between the clipper 190 and the summer 196. Node 204 is on the signal line between notch filter 194 and summer 196. Node 206 is one the signal line between notch filter 192 and summer 198. Node 208 is on the signal line between summers 196 and 198. Node 209 is on the signal line between summer 198 and the output terminal.

Figure 15B:
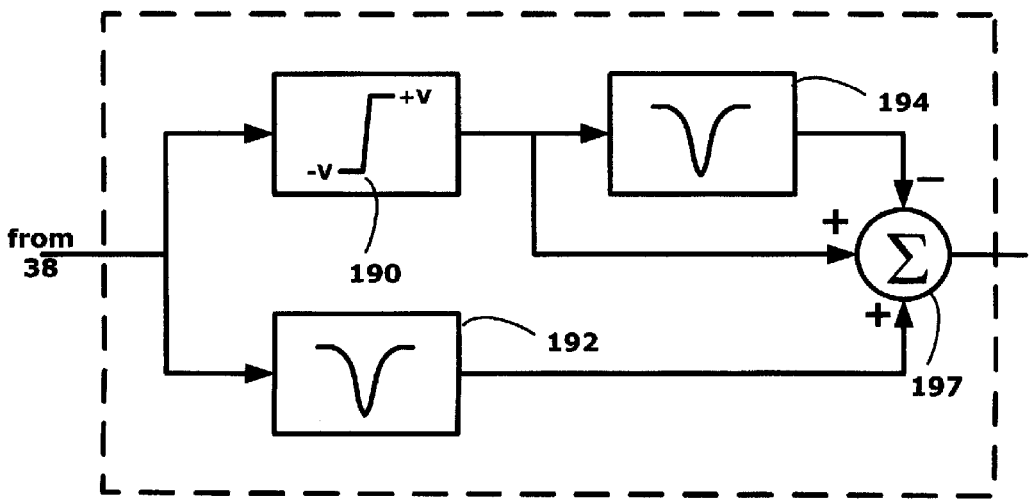

FIG. 15B shows a variation of the circuit of FIG. 15A. In the circuit of FIG. 15B, summers 196 and 198 of FIG. 15A have been combined into summer 197. The circuits of FIGS. 15A and 15B perform essentially the same function.

Figure 15C:
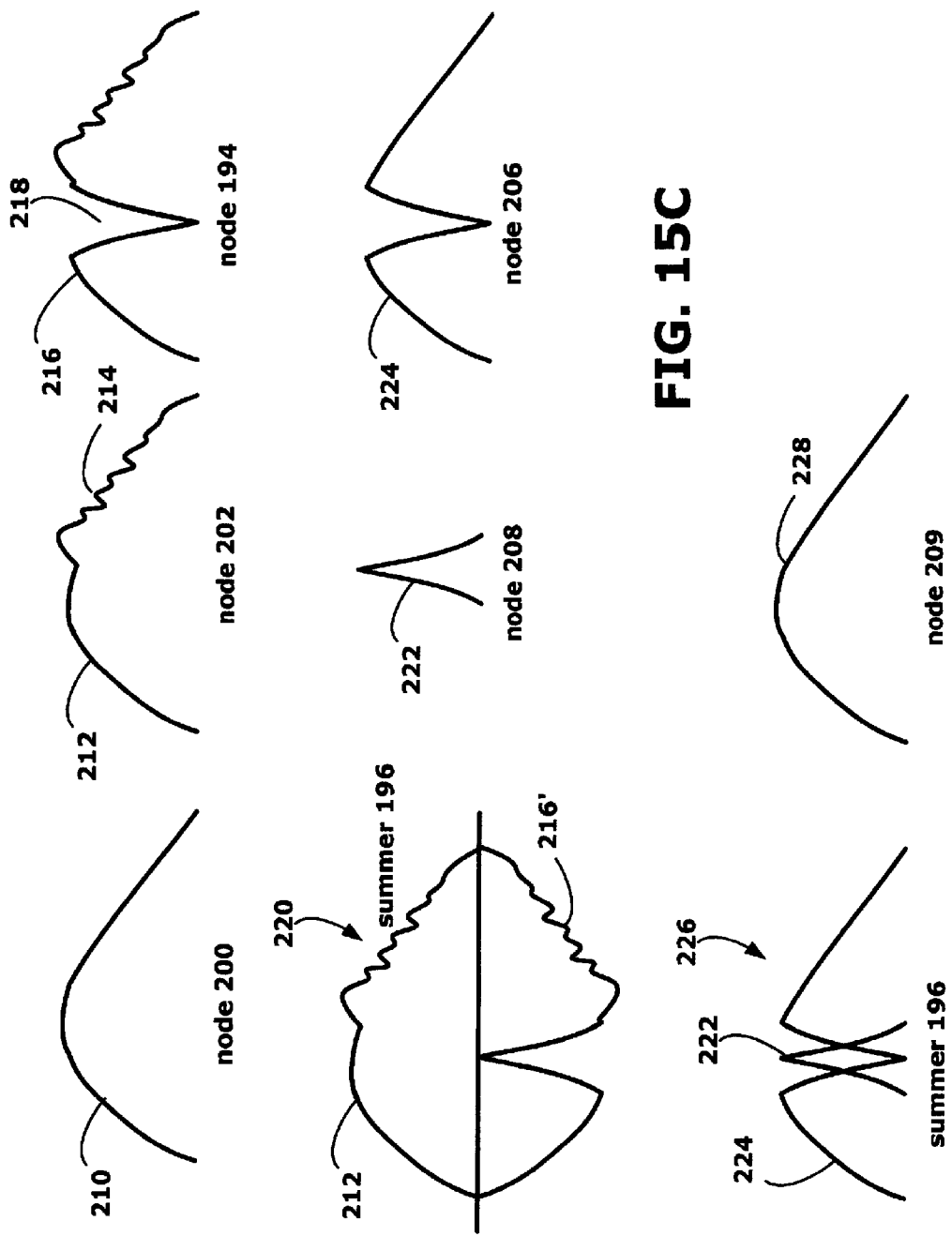
FIG. 15C shows frequency response curves illustrating the operation of the circuits of FIGS. 15A and 15B.

Referring to FIGS. 15C and 15A, there are shown exemplary frequency response patterns at the nodes of FIG. 15A. Curve 210 is a frequency response of an audio signal. Curve 212 is a frequency response curve at node 202. After clipping, curve 212 has undesirable distortion 214. Curve 216 is a frequency response curve at node 204, following notch filter 194. Curve 220 illustrates the summation at summer 196. Curve 216' is an inverted curve 216, indicating the differential summation. Curve 222 is a frequency response at node 208, after summation at summer 196. Curve 224 is a frequency response at node 206, after notch filter 192. Curve 226 illustrates the summation at summer 198. Curve 228 is a frequency response at node 209 after the summing at summer 198.

Notch filters 192 and 194 may be centered at approximately the frequency of maximum excursion of the electroacoustical transducer, or at some other notable frequency, such as approximately the frequency at which impedance is low and the power supply is stressed. Clipper 190 may be a bipolar clipper or some other form of clipper that limits the amplitude of signal in a small frequency band. Notch filters 192 and 194 can be notch filters as shown, or can be a band pass or low pass filter.

In operation, the circuit of FIGS. 15A and 15B effectively disassemble and reassemble the input signal as a function of frequency, using portions of both the clipped and unclipped signals. The portion of the distortion-prone clipped signal that is used is near the maximum excursion frequency of the electroacoustical transducer or transducers, where it may be desirable to limit the maximum signal applied. The larger portion of the reassembled frequency response curve is from an unclipped frequency response curve, which typically contains less distortion than the clipped frequency response curve. The circuit may also be modified to clip at more than one frequency, or to clip at a frequency other than the maximum excursion frequency. In some applications, the notch filter could be replaced by a low pass or bandpass filter. The circuit of FIGS. 15A and 15B limits the maximum amplitude signal at a predetermined frequency or frequencies, does not limit at other frequencies, and applies the clipping in a manner that introduces a minimum of distortion.

Signal conditioners 89 and 90 and combining and filtering circuitry 14 of FIG. 12 and their component elements can be modified and reconfigured in many ways. For example, signal conditioners 89 and 90 may be used independently; that is, either can be used without the other. In systems that have both signal conditioners 89 and 90 and combining and filtering circuitry 14, the order may be reversed; that is, the signals may first be combined and filtered, then conditioned. Either of the elements (compressor 160 and level dependent dynamic equalizer 162 of FIG. 13A) of the signal conditioner can be used independently; that is either can be used without the other.

Figure 16:
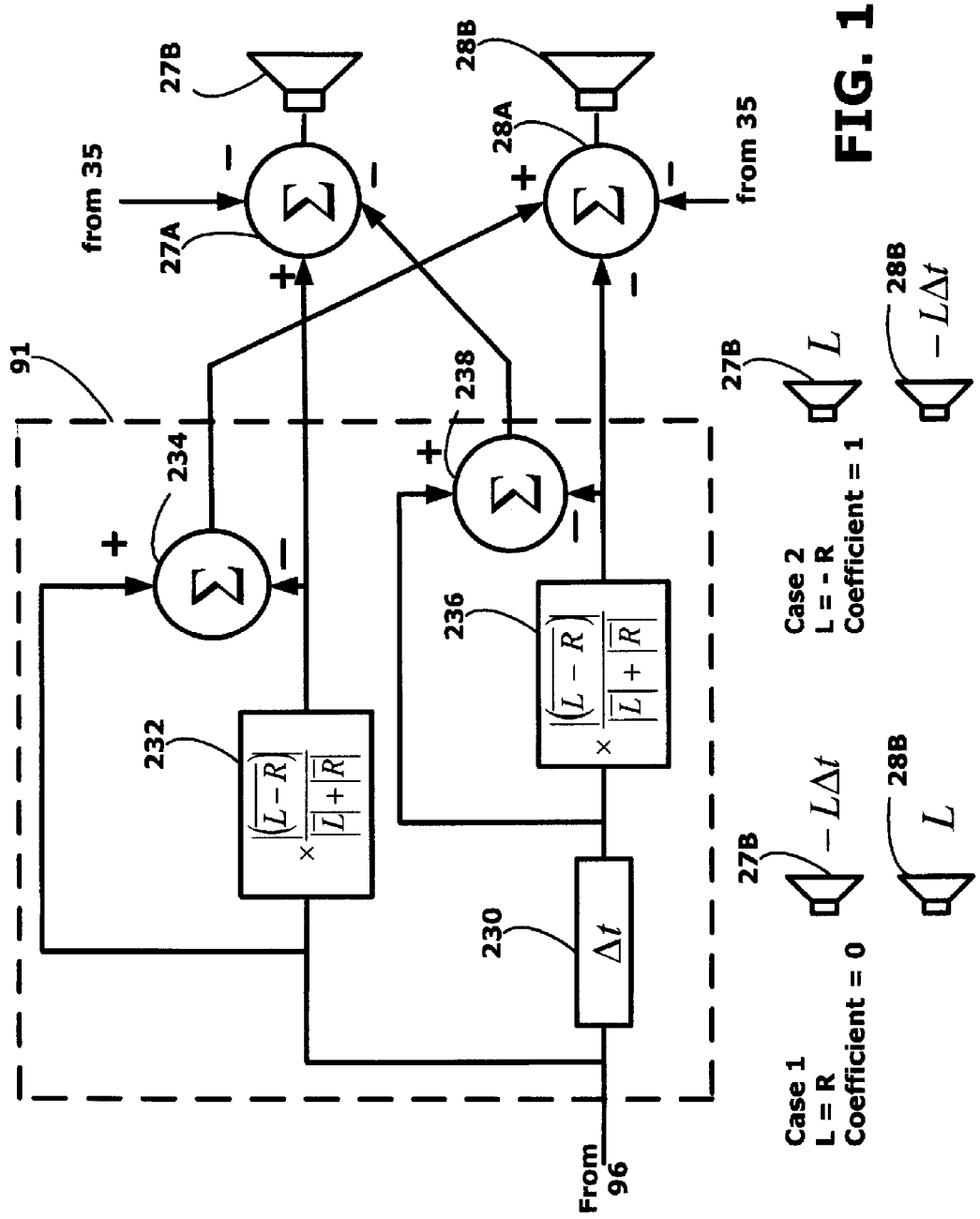
FIG. 16 is a block diagram of another of the elements of FIG. 12.

Referring to FIG. 16, there is shown the directivity controlling circuitry 91 in greater detail. The signal line from summer 96 of combining and filtering circuitry 14 of FIG. 14 is coupled the time delay 230, to multiplier 232 and to summer 234. Time delay 230 is coupled to multiplier 236 and summer 238. Multiplier 232 is coupled differentially to summer 234 and additively to summer 27A. Multiplier 236 is coupled differentially to summer 238 and additively to summer 28A. Summer 234 is coupled to summer 28A. Summer 238 is coupled to summer 27A. Summer 27A is coupled to signal to electroacoustical transducer 27B. Summer 28A is coupled to electroacoustical transducer 28B. Processing block 35 (not shown) of FIG. 14 is coupled to summers 27A and 28A.

Since time and phase may be related in a known way, time delay 230 may be implemented in the form of one or more phase shifters. Time delay may also be implemented using non-minimum phase devices. In a DSP based system, time delay can be accomplished by direct delay of data samples for a number of clock cycles. Phase shifters may be implemented as all-pass filters or as complementary all-pass filters.

In operation, the audio signal from summer 96 of combining and filtering circuitry 14 is attenuated by multiplier 232 by an attenuation factor of $$\frac{(\overline{L-R})}{|\overline{L}|+|\overline{R}|}$$

and combined differentially with the unattenuated signal at summer 234. The combined signal is then transmitted to summer 28A. Additionally, the output of multiplier 232 is transmitted to summer 27A. The audio signal from summer 96 of combining and filtering circuitry 14 is time delayed by time delay 230, attenuated by multiplier 236 by an attenuation factor of $$\frac{(\overline{L-R})}{|\overline{L}|+|\overline{R}|},$$

and combined differentially with the unattenuated signal at summer 238. The combined signal is then transmitted to summer 27A. Additionally, the output of multiplier 236 is transmitted to summer 28A. Summers 27A and 28A may also receive the low frequency audio signal from processing block 35 of audio signal processing circuitry 22. The combined signals at summers 27A and 28A are then radiated by electroacoustical transducers 27B and 28B, respectively. The time delay Δt, the spacing, and the orientation of transducers 27B and 28B may be arranged to radiate sound energy directionally, as described in U.S. Pat. Nos. 5,809,153 and 5,870, 484, and as implemented in the systems of FIGS. 3A, 3B, 4, 5, 6, 7, and 11.

The directivity of the array of electroacoustical transducers 27B and 28B can be controlled by controlling the correlation, the amplitudes, and the phase relationships of the L and R signals. Two cases are illustrated at the bottom of FIG. 16. If L=R (that is, a monaural signal, in phase), the value of the attenuation factor is zero and signal −LΔt but substantially no L signal is transmitted to transducer 27B, and signal L but substantially no −LΔt is transmitted to transducer 28B. If L=−R (that is, same magnitude, and in phase opposition), and the value of the coefficient is one and signal −LΔt but substantially no L signal is transmitted to transducer 28B and signal L but substantially no −LΔt signal is transmitted to transducer 27B, resulting in a substantially different directivity pattern.

The result of the processing of the circuit of FIG. 16 is that a signal that has been attenuated by a factor of $$\frac{(\overline{L-R})}{|\overline{L}|+|\overline{R}|}$$

is summed at summer 27A with a time delayed or phase shifted signal that has been attenuated by a factor of $$-\left(1-\frac{(\overline{L-R})}{|\overline{L}|+|\overline{R}|}\right)$$

and phase inverted (indicated by the minus sign) and with a low frequency audio signal from element 35 and is transduced by the transducer 27B. A signal of that has been attenuated by a factor of $$\left(1-\frac{(\overline{L-R})}{|\overline{L}|+|\overline{R}|}\right)$$

is combined at summer 28A with a time delayed signal that has been attenuated by a factor of $$-\frac{(\overline{L-R})}{|\overline{L}|+|\overline{R}|}$$

and phase inverted (indicated by the minus sign) and with a low frequency audio signal from element 35 and is transduced by the transducer 28A. Varying the magnitude, correlation, and phase of the L and R signals can result in different radiation patterns, as described in the discussion of FIG. 4. In addition to the signal-dependent directivity control of FIG. 16, other arrangements, such as user accessible switches or automatic switches or signal processing can vary the directivity pattern continuously or incrementally and can be made based on the occurrence of some event.

Directivity controlling circuitry 92 has substantially the same elements as directivity controlling circuitry 91, arranged in substantially the same configuration and performs substantially the same operations in substantially the same manner.

Additionally, the directivity controlling circuits of FIG. 16 can be used for other channels, such as surround channels. The surround channels signals may be processed to be radiated by transducers 27B and 28B, or may be processed to be radiated by other transducers.

Figure 17A:
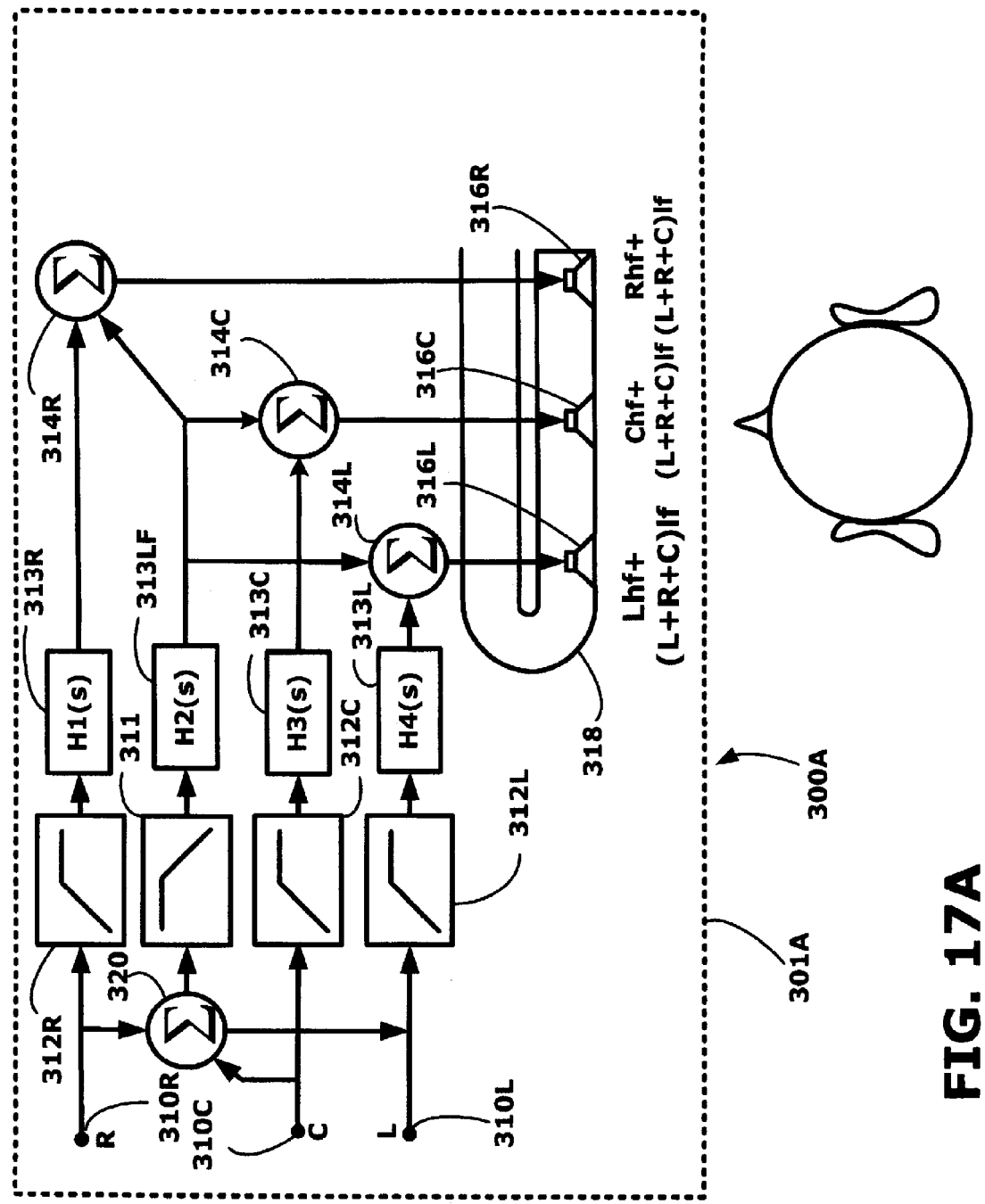
FIGS. 17A and 17B are diagrams of another audio signal processing system embodying the invention.
Figure 17B:
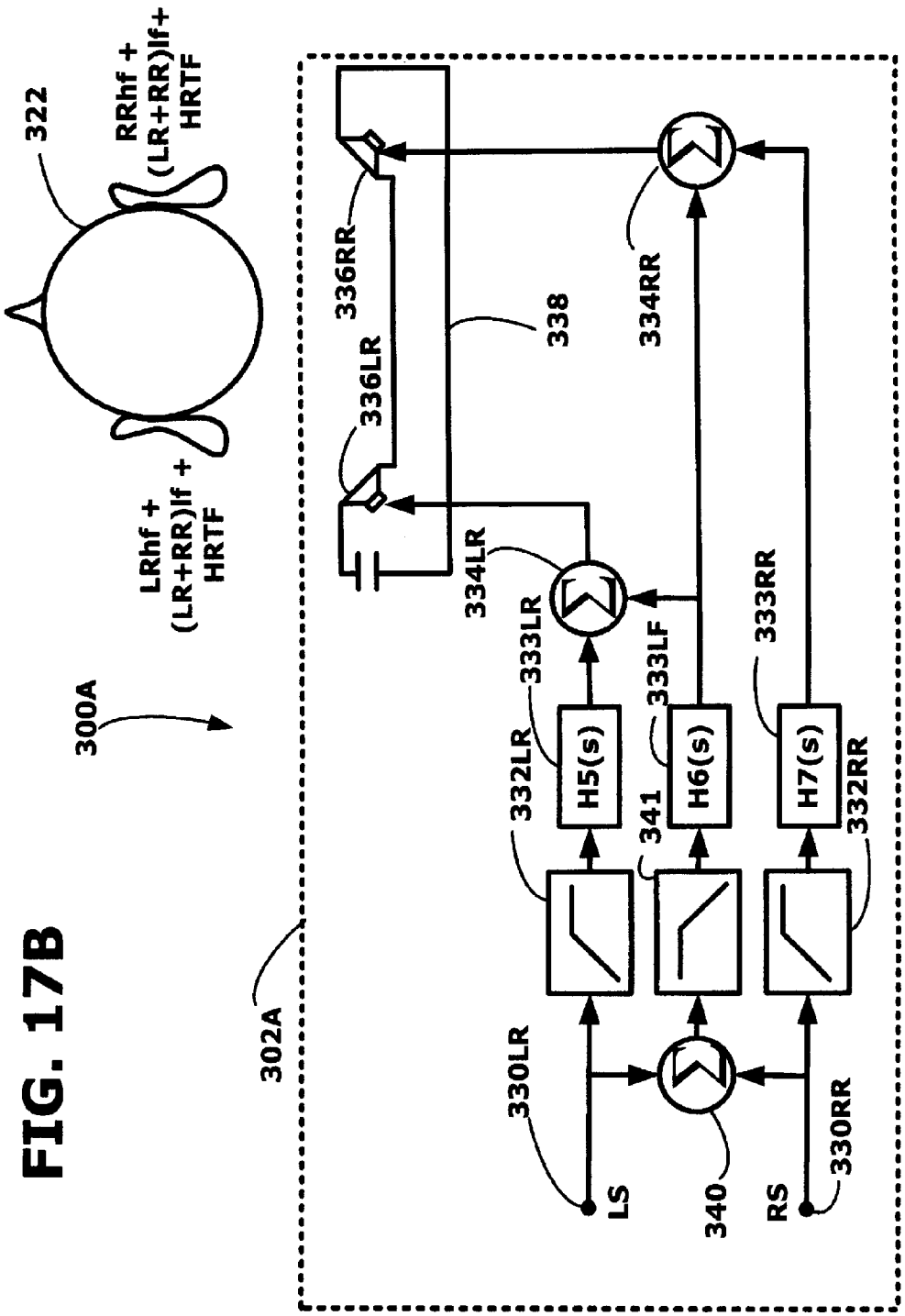

Referring to FIGS. 17A and 17B, there is shown another embodiment of the invention. An audio system 300A includes a front audio system 301A, which has input terminals 310L, 310C, and 310R for the left (L), center (C), and right (R) channels of a multichannel audio system. Each of the input terminals is coupled to a high pass filter 312L, 312C, and 312R, each of which is in turn coupled to one of processing blocks 313L, 313C, and 313R. Each of processing blocks 313L, 313C, and 313R is coupled to a summer 314L, 314C, and 314R, each of which is coupled to electroacoustical transducer 316L, 316C, and 316R, respectively. Electroacoustical transducers 316L, 316C, and 316R are mounted so that they radiate sound waves into a low frequency augmenting device, such as a waveguide 318. Input terminals 310L, 310C, and 310R are coupled to a summer 320, which is coupled to a low pass filter 311. Low pass filter 311 is coupled to processing block 313LF, which is in turn coupled to summers 314L, 314C, and 314R, respectively. As in previous figures, some or all of the input terminals 310L, 310C and 310R may be coupled to summer 320 by a phase shifter such as elements 37A and 37B of FIG. 1A. The elements may be arranged in different orders. Filters 312L, 312C, and 312R may be incorporated in the transfer functions of the processing blocks 313L, 313C, and 313R. The transfer functions may incorporate processes such as phase shifting, delaying, signal conditioning, compressing, clipping, equalizing, HRTF processing and the like, or may represent zero or unity. Additionally, the transducers 316L, 316C, and 316R may be mounted so that they radiate sound waves into waveguide 318 through an acoustic volume, as shown in previous figures.

Front audio system 301A operates in manner described in previous figures, such as FIG. 3C. Electroacoustical transducers 316L, 316C, and 316R each radiate a channel high frequency sound waves (Lhf, Chf, and Rhf, respectively) and also radiate combined low frequency sound waves (L+R+C) lf. The low frequency augmenting device, such as the waveguide 318, augments the production of low frequency sound waves.

The audio system 300A may also include a rear audio system 302A, shown in FIG. 17B. Rear audio system 302A includes input terminals 330LR and 330RR for the left rear (LR) and right rear (RR) channels of a multichannel audio system. Each of the input terminals is coupled to one of high pass filters 332LR and 332RR, each of which is in turn coupled to one of processing blocks 333LR and 333RR. Each of summers 334LR, 334RR, is coupled to an electroacoustical transducer 336LR and 336RR, respectively. Electroacoustical transducers 336LR and 336RR are mounted so that they radiate sound waves into a low frequency augmenting device, such as a ported enclosure 338. Each of input terminals 330LR and 310RR is also coupled to summer 340, which is in turn coupled to a low pass filter 341. Low pass filter 341 is coupled to a processing block 333LR, which is in turn coupled to summers 334LR and 34RR. As in previous figures, one or both of the input terminals 330LR and 330RR may be coupled to summer 340 by a phase shifter such as elements 37A and 37B of FIG. 1A. The elements may be arranged in different orders. Filters 332LR and 332RR may be incorporated in the transfer functions of the processing blocks 333LR and 333RR. The transfer functions may incorporate processes such as phase shifting, delaying, signal conditioning, compressing, clipping, equalizing, and the like, or may represent zero or unity. Additionally, the transducers 336LR and 336R may be mounted so that they radiate sound waves into a low frequency augmenting devices such as a ported volume or an enclosure with a passive radiator.

Rear audio system 302A operates in manner similar to previously described embodiments and may also operate in a manner similar to the rear acoustic radiating devices of copending U.S. patent application Ser. No. 10/309,395. The LR signals and RR signals may include left surround and right surround channel audio signals, respectively, and may also include head related transfer function (HRTF) elements such as interaural time difference, interaural phase difference, interaural level difference, or monaural spectral cues to more accurately place the image of an acoustic source for the listener 322. The transducers may also be coupled to other elements by circuitry such as is described above so that they can radiate sound with varying degrees of directionality.

An audio system according to the embodiment of FIGS. 17A and 17B is advantageous for reasons mentioned previously. In addition, an audio system according to FIGS. 17A and 17B and radiate realistic locational information to the listener 22, and can radiate different locational information to listeners of many multimedia entertainment devices in the same listening area. Each listener hears the sound associated with the corresponding multimedia device more clearly than the listener can hear sound associated with other multimedia entertainment devices because of the proximity to the listener, as well as the natural directivity of the transducer at very high frequencies.

Figure 18:
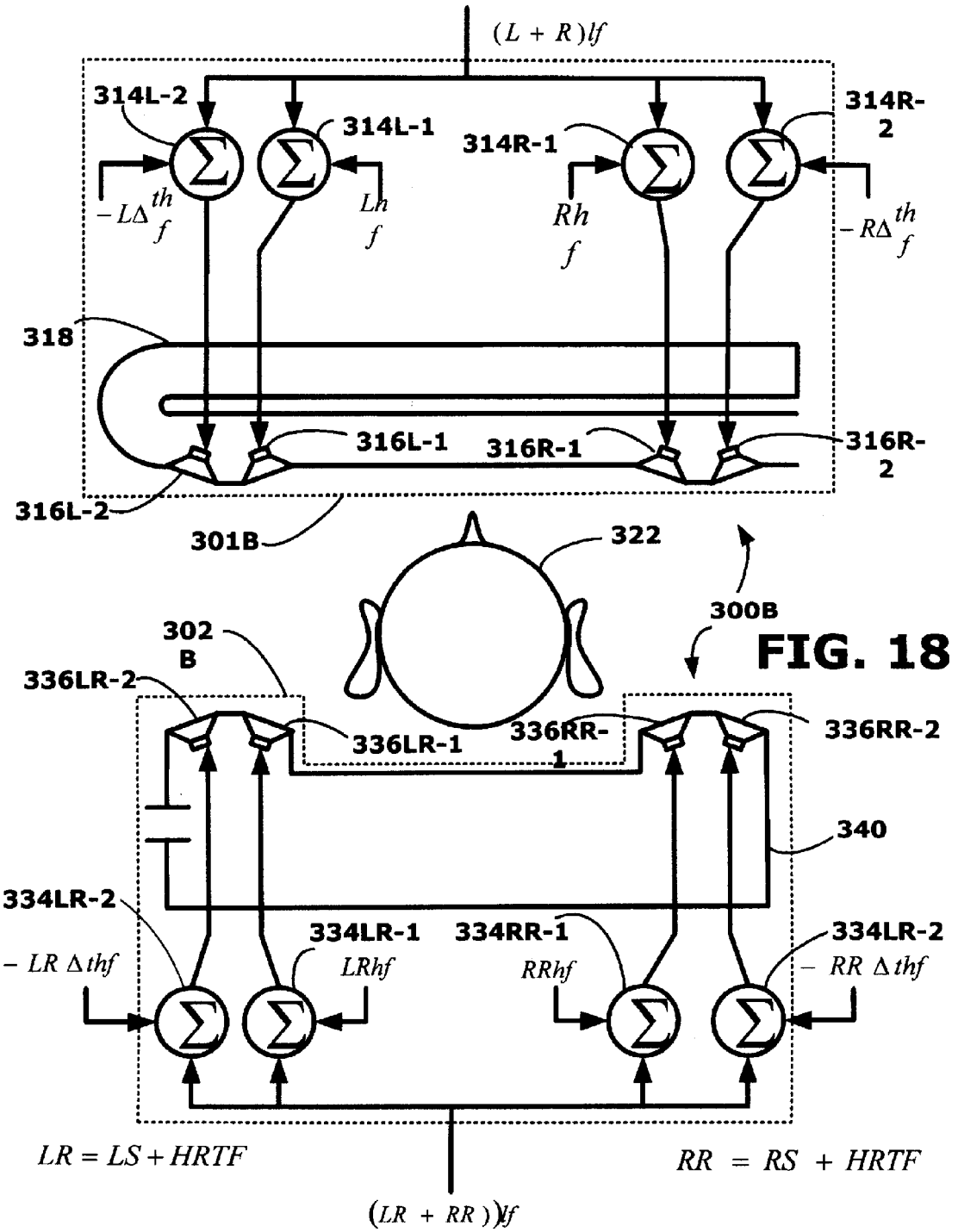
FIG. 18 is a diagram of another implementation of the audio signal processing system of FIGS. 17A and 17B.

Referring to FIG. 18, there is shown another implementation of the embodiment of FIGS. 17A and 17B. In FIG. 18, a signal processing system employing the circuitry of FIG. 2 provides a left signal L, a right signal R, a left rear signal LR, and a right rear signal RR. Transducer 316C may be the same as in FIG. 17A, or may be replaced by a directional array, or the center channel may be downmixed as in FIG. 8B and transducer 316C of FIG. 17A omitted. The transducers 316L, 316R, 336LS and 336RS of FIGS. 17A and 17B are replaced by directional arrays. The implementation of FIG. 18 may use two signal processing system similar to the system of FIGS. 1A and 1B, or FIG. 2, one for the front and one for the back to accommodate both front and rear radiation. Transducer 316L and summer 314L of FIG. 17A are replaced by a directional array including transducers 316L-1 and 316L-2 together with a corresponding signal summer 314L-1 and 314L-2. Transducer 316R of FIG. 17A and summer 314R are replaced by a directional array including a transducers 316R-1 and 316R-2 together with corresponding summers 314L-1 and 314L-2. Transducers 316L-1, 316L-2, 316R-1 and 316R-2 may be mounted so that one radiating surface of each transducer radiates sound wave to the external environment and so that one radiating surface of each transducer radiates sound waves into a low frequency radiation augmenting device such as acoustic waveguide 318. Similarly transducer 336LR and summer 333LR of FIG. 17B are replaced by a directional array including transducers 336LR-1 and transducer 336RR-1, together with corresponding summers 334LR-1 and 334LR-2. Transducer 336RR may be replaced by a directional array including a transducers 336RR-1, which receives an audio signal from summer 334RR-1 and transducer 336RR-2, which receives an audio signal from summer 334RR-2. Transducers 336LR-1, 336LR-2, 336RR-1 and 336RR-2 may be mounted so that one radiating surface of each transducer radiates sound wave to the external environment and so that one radiating surface of each transducer radiates sound waves into a low frequency radiation augmenting device such as ported enclosure 340.

In the implementation of FIG. 18, transducers 316L-1, 316L-2, 316R-1, and 316R-2 all receive a combined left and right low frequency signal (L+R)lf. Additionally, transducer 316L-1 receives high frequency left signal Lhf; transducer 316L-2 receives high frequency Lhf signal, polarity reversed and time delayed; transducer 316R-1 receives high frequency signal Rhf; and transducer 316R-2 receives signal Rhf, polarity reversed and time delayed. Transducers 316L-1 and 316L-2 operate as a directional array radiating sound waves corresponding to the Lhf signal in a manner such that more acoustic energy is radiated toward listener 322 than toward listeners in adjacent listening spaces. Similarly, transducers 316R-1 and 316R-2 operate as a directional array radiating sound waves corresponding the Rhf signal in a manner such that more acoustic energy is radiated toward listener 322 than toward listeners in adjacent listening spaces. Acoustic waveguide 318 coacts with transducers 316L-1, 316L-2, 316R-1, and 316R-2 to augment the radiation of low frequency acoustic energy.

Transducers 336LR-1, 336LR-2, 336RR-1, and 336RR-2 all receive a combined left rear and right rear low frequency signal (LR+RR)lf. Additionally, transducer 336LR-1 receives high frequency left signal LRhf; transducer 336LR-2 receives high frequency LRhf signal, polarity reversed and time delayed; transducer 336RR-1 receives high frequency signal Rhf; and transducer 336RR-2 receives signal RRhf, polarity reversed and time delayed. Transducers 336LR-1 and 336LR-2 operate as a directional array radiating sound waves corresponding to the LRhf signal in a manner such that more acoustic energy is radiated toward listener 322 than toward listeners in adjacent listening spaces. Similarly, transducers 336RR-1 and 336RR-2 operate as a directional array radiating sound waves corresponding to the RRhf signal in a manner such that more acoustic energy is radiated toward listener 322 than toward listeners in adjacent listening spaces. Ported enclosure 340 coacts with transducers 316LR-1, 316LR-2, 316RR-1, and 316RR-2 to augment the radiation of low frequency acoustic energy.

The left rear LR and right rear RR signal may correspond to left and right surround signals, or may include other or additional information, for example HRTF information as in FIGS. 17B and 18, or other information such as individualized sound tracks or audio messages.

Other implementations of the system FIGS. 17A and 17B and the system of FIG. 18 may be implemented by combining front audio system 301A of FIG. 17A with back audio system 302B of FIG. 18, or by combining back audio system 302A of FIG. 17A with front audio system 301B of FIG. 18. Other features of other embodiments, such as the level dependent dynamic equalizer and the compressor of FIGS. 13A-13C or the variable directivity components of FIG. 16 may be employed in the implementations of FIGS. 17A, 17B, and 18.

Figure 19:
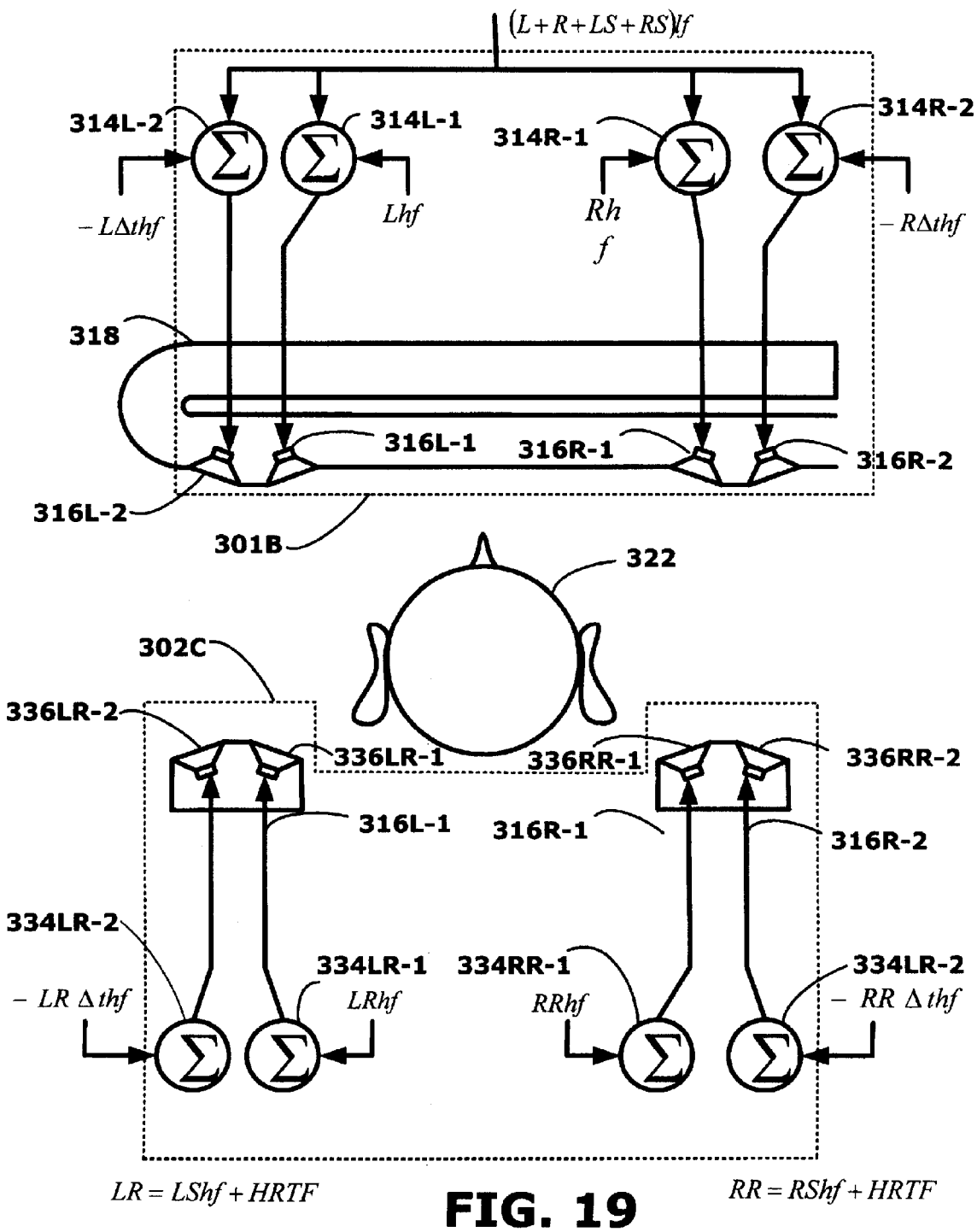
FIG. 19 is an alternate implementation of the audio signal processing system of FIG. 18.

FIG. 19 shows another implementation of the system of FIGS. 17A and 17B and 18. In the implementation of FIG. 19, the rear audio system 302C low frequency augmenting device of FIG. 17B or 340 of FIG. 18 is omitted. Transducers 336LR-1, 336LR-2, 336RR-1 and 336RR-2 may be positioned in a small enclosure, preferably close to the head of a listener 322. The LR signal includes the high frequency portion of the LS signal, with HTRF processing as described in U.S. patent application Ser. No. 10/309,395 if desired. The RR signal includes the high frequency portion of the RS signal, with HRTF processing if desired. The low frequency portion of signals LS and RS may be routed to summers 314L-1, 314L-2, 314R-1, and 314R-2, so that all low frequency acoustic energy is radiated by transducers of the front audio system 301B.

In an alternate configuration of FIG. 19, the front audio system may be similar to the front audio system 301A of FIG. 17A OR 301B of FIG. 18. In another alternate configuration of FIG. 19, front low frequency augmenting device such as waveguide 318 may be omitted, and all low frequency signals may be radiated by a rear audio system such as 302A of FIG. 17B, 302B of FIG. 18, or 302C.

Implementations according to FIGS. 17A and 17B or FIG. 18 are especially well suited for situations in which large numbers of audio sources playing different audio program material (such as gambling machines or video games or other multimedia entertainment device) are in relatively close proximity in a common listening area. Implementations according to FIGS. 17A and 17B or FIG. 18 permit radiating of all surround sound channels with accurate placing of acoustic images and sufficient low frequency radiation without the need for separate low frequency loudspeakers.

It is evident that those skilled in the art may now make numerous uses of and departures from the specific apparatus and techniques disclosed herein without departing from the inventive concepts. Consequently, the invention is to be construed as embracing each and every novel feature and novel combination of features disclosed herein and limited only by the spirit and scope of the appended claims.

What is claimed is:

1. A method for clipping and post-clipping processing an audio signal, comprising:
   clipping an audio signal to provide a clipped audio signal;
   filtering, by a first filter, said audio signal to provide a filtered unclipped audio signal;
   filtering, by a second filter, said clipped audio signal to provide a filtered clipped audio signal;
   differentially combining said filtered clipped audio signal and said clipped audio signal to provide a differentially combined audio signal; and
   combining said filtered unclipped audio signal and said differentially combined audio signal to provide an output signal.

2. A method for clipping an audio signal in accordance with claim 1, wherein said first filter is a notch filter.

3. A method for clipping an audio signal in accordance with claim 2, wherein said second filter is a notch filter.

4. A method for clipping an audio signal in accordance with claim 3 wherein said first filter and said second filter have substantially the same notch frequency.

\* \* \* \* \*